(12) United States Patent
Miller et al.

(10) Patent No.: US 7,676,715 B2
(45) Date of Patent: Mar. 9, 2010

(54) INTEGRATED CIRCUIT WITH CONTINUOUS TESTING OF REPETITIVE FUNCTIONAL BLOCKS

(75) Inventors: Gary L. Miller, Austin, TX (US); Hugo Mauro V D C Cavalcanti, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 272 days.

(21) Appl. No.: 11/755,448

(22) Filed: May 30, 2007

(65) Prior Publication Data

US 2008/0301511 A1    Dec. 4, 2008

(51) Int. Cl.
*G01R 31/28* (2006.01)
*G11C 29/00* (2006.01)

(52) U.S. Cl. .................. 714/724; 714/710; 714/723

(58) Field of Classification Search ............. 714/710, 714/718, 719, 723, 724, 726, 30, 733, 734; 365/200, 201
See application file for complete search history.

(56) References Cited

U.S. PATENT DOCUMENTS

| 6,087,841 | A | 7/2000 | Bonaccio et al. | |
|---|---|---|---|---|
| 6,522,985 | B1 * | 2/2003 | Swoboda et al. | 702/117 |
| 7,055,077 | B2 | 5/2006 | Kiryu et al. | |
| 7,173,443 | B1 | 2/2007 | Asami | |
| 2006/0109841 | A1 | 5/2006 | Wagner et al. | |

FOREIGN PATENT DOCUMENTS

| JP | 2002-189060 A | 7/2002 |
|---|---|---|
| JP | 2007-33135 A | 2/2007 |

* cited by examiner

*Primary Examiner*—Phung M Chung
(74) *Attorney, Agent, or Firm*—Gary R. Stanford

(57) ABSTRACT

A method of continuous testing of repetitive functional blocks provided on an integrated circuit (IC) which includes selecting one of the repetitive functional blocks at a time for testing, substituting a test repetitive functional block for a selected repetitive functional block, and testing the selected repetitive functional block during normal functional mode of the IC. An IC which includes repetitive functional blocks for performing corresponding functional block operations during normal functional mode of the IC, and a test system which performs continuous testing of each repetitive functional block while the functional block operations are performed during normal functional mode of the IC. One block may be tested during normal operation for each IC reset event without transferring or copying state information. Multiple blocks may be tested one at a time during normal operation by transferring state information between a selected block and a test block.

20 Claims, 11 Drawing Sheets

INTEGRATED CIRCUIT WITH CONTINUOUS TESTING OF REPETITIVE FUNCTIONAL BLOCKS

BACKGROUND OF THE INVENTION

1. Field of the Invention

This disclosure relates generally to testing on integrated circuits, and more specifically, to a system and method for continuous testing of repetitive functional blocks on an integrated circuit.

2. Description of the Related Art

The International Electrotechnical Commission (IEC) is a global organization that prepares and publishes international standards for all electrical, electronic and related technologies. These standards serve as a basis for national standardization and as references when drafting international tenders and contracts and the like. Stringent safety integration levels from newer standards, such as the international standard IEC 61508, are being applied to various applications including those that were not traditionally required to meet relatively strict safety integration levels. The stringent safety integration standards are, however, soon to be pervasive in many applications, thus raising the standards and level of entry for those applications subject to the standards.

The 65 nanometer (65 nm) process is currently an advanced lithographic node used in volume manufacturing of semiconductors, such as including complementary metal-oxide-semiconductor (CMOS) and the like. At the 65 nm lithographic node and beyond, design for manufacturability is important to assure adequate yield and reliability. Additionally, even traditionally reliable silicon structures may be less reliable when implemented using the more advanced lithographic nodes. For example, a D-type flip-flop (DFF), which is conventionally a relatively reliable silicon structure, becomes more sensitive to leakage current or soft errors at the higher technology nodes. Safe and reliable operation of deep submicron products is an increasing problem, particularly when these semiconductor products are used in applications and products that must meet more stringent industry standards, such as the international standard IEC 61508 and the like. Adequate yield and reliability also become more difficult to achieve technology advances.

It is desired to ensure safe and reliable operation and to ensure adequate yield and reliability of deep submicron integrated circuit (IC) semiconductor devices. Many such devices include repetitive functional blocks, such as multiple logical channel implementations, multiple processor cells, etc. It is desired to ensure proper operation of each repetitive functional block provided on the IC. It is desired to provide continuous testing of the functional blocks during normal operation of the IC.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
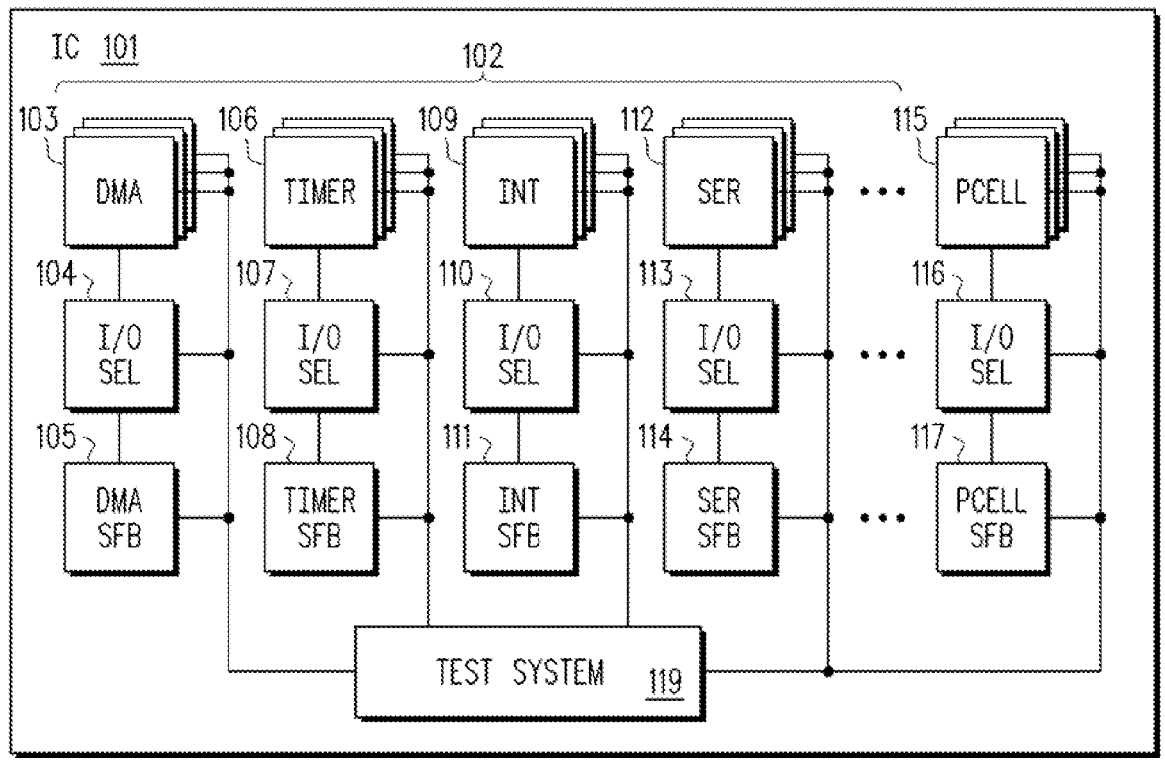
FIG. 1 is a simplified block diagram of a chip or integrated circuit (IC) including a test system implemented according to one embodiment used for continuous testing of repetitive functional blocks integrated on the IC during normal functional mode of the IC.

FIG. 1 is a simplified block diagram of a chip or integrated circuit (IC) 101 including a test system 119 implemented according to one embodiment used for continuous testing of repetitive functional blocks integrated on the IC 101 during normal functional mode of the IC 101. In the illustrated embodiment, the IC 101 includes multiple channels 102 as one example of repetitive functional blocks. The channels 102 include various channel types, such as several direct memory access (DMA) channels 103, several timer peripherals 106, several interrupt (INT) control channels 109, several serial (SER) peripherals 112, etc. Other types of channel implementations are possible and contemplated. The IC 101 further includes repetitive processor cells (PCELL) 115, in which each processor cell is implemented in substantially identical manner so that each may be tested using substantially the same test methodology. Other types of repetitive functional blocks are contemplated. Test system 119 is integrated on the IC 101 and coupled to each of the channels 102 and to each of the processor cells 115 for purposes of continuous testing as further described herein.

The term "repetitive" as used herein means that each type of functional block is duplicated or repeated several times on the IC 101 to perform similar types of functions in parallel as known to those skilled in the art. Each type of functional block is implemented in substantially identical manner and may be tested using substantially the same test methodology. For example, each DMA channel may be tested in substantially the same manner using the same test methodology. It is noted, however, that different types of functional blocks are generally tested differently. For example, the DMA channels are tested according to a first test methodology, the timer peripherals are tested according to a second test methodology, the processor cells are tested according to a third test methodology, and so on. The physical repetitive functional blocks are assigned corresponding unique logical identifiers, such as numbers or logical addresses or the like, in which the logical identifiers are used by other circuitry or logic to access the corresponding physical functional blocks for performing corresponding functional block operations. A logical identifier of a first physical functional block may be re-mapped to another physical functional block, which resumes the functional block operation of the first physical functional block. Such redirection or logical remapping facilitates testing of the first physical functional block without disabling its functional operations.

It is desired to provide continuous testing of each of the channels 102 and the processor cells 115 during normal functional mode to ensure safe and reliable operation for the life of the IC 101. The test system 119 includes corresponding test logic for testing each type of functional block according to the desired test methodology for that type. Various types of test method are contemplated for testing each of the repetitive functional blocks, such as scan, logic built-in self test (LBIST), functional testing, etc. Each type of functional block includes a spare functional block (SFB) also coupled to the test system 119. The spare functional blocks include a DMA channel SFB 105, a timer peripheral SFB 108, an interrupt control channel SFB 111, a serial peripheral SFB 114, a PCELL SFB 117, etc. As described further below, the test system 119 includes test select logic which diverts operation of a selected functional block to be tested to the corresponding spare functional block, which is effectively substituted for the selected functional block, and the selected functional block is tested by the test logic of the test system 119. The spare functional blocks are also continuously tested. Each set of functional blocks includes input/output select (I/O SEL) logic coupled to the test system 119 to perform logical identification re-assignment to facilitate functional redirection and testing. In particular, I/O SEL logic 104 is provided between the DMA channels 103 and the DMA channel SFB 105, I/O SEL logic 107 is provided between the timer peripherals 106 and the timer peripheral SFB 108, I/O SEL logic 110 is provided between the interrupt control channels 109 and the interrupt control channel SFB 111, I/O SEL logic 113 is provided between the serial peripherals 112 and the serial peripheral SFB 114, I/O SEL logic 116 is provided between the processor cells 115 and the PCELL SFB 117, etc.

Figure 2:
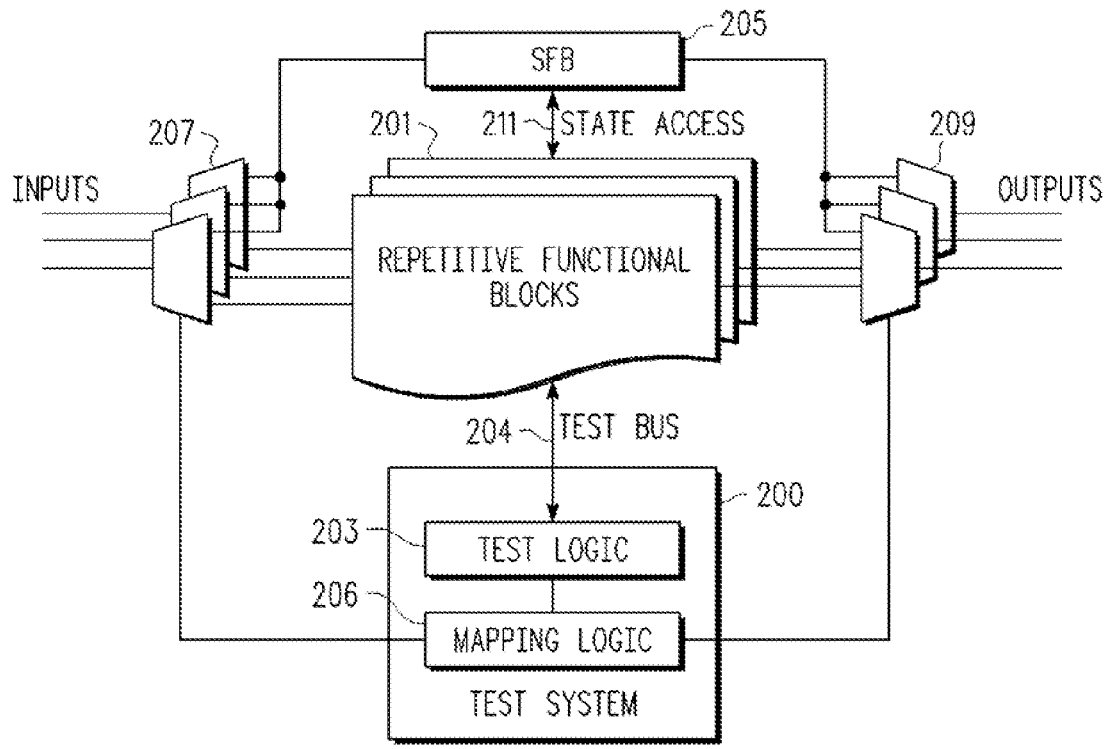
FIG. 2 is a block diagram of a functional block test system according to one embodiment which may be implemented on the IC of FIG. 1 for continuously testing repetitive functional blocks on the IC during normal functional mode of the IC.

FIG. 2 is a block diagram of a functional block test system according to one embodiment including a test system 200 which is implemented on the IC 101 for continuously testing repetitive functional blocks 201 on the IC 101 during normal functional mode of the IC 101. The repetitive functional blocks 201 represent any one set of the channels 102 (e.g., DMA channels, timer peripherals, etc.), or the set of processor cells 115, or any set of repetitive functional blocks that may be provided on an integrated circuit, including the IC 101. A spare functional block (SBF) 205 is also included. The test circuit 200 includes test logic 203 for testing any one of the repetitive functional blocks 201 and the SFB 205 according to one or more selected test methods based on the type of functional block. The SBF 205 represents the spare functional block that corresponds to the particular type of functional block being tested, and which operates as the "test" functional block which substitutes for a selected functional block during testing. The test logic 203 controls mapping logic 206 for selecting a repetitive functional block for testing. A test bus 204 including test access signal lines provides access between the test logic 203 and the repetitive functional blocks 201 for purposes of conducting the testing of each functional block. In the illustrated embodiment, only one of the repetitive functional blocks 201 is tested at a time and it is desired to test each functional block during normal functional operation of the IC 101. The SBF 205 is provided to effectively cache or temporarily take over the current operations of the selected functional block to be tested. Input select logic 207 and output select logic 209 are controlled by the test select logic 203 to redirect the inputs and outputs of a selected functional block to the SBF 205 so that the selected functional block is isolated and available for testing.

The mapping logic 206 controls the input and output select logic 207 and 209 to effectively revise the "virtual" or logical mapping of the physical repetitive functional blocks 201 and to redirect state information to facilitate continuous testing of the repetitive functional blocks during normal functional mode of the IC 101. State access signal lines 211 enable the transfer of the current state of the selected functional block to be tested to the SBF 205 so that the SBF 205 resumes normal operation of (and thus substitutes for) the functional block during the test operations. In general, the repetitive functional blocks represent multiple physical identifications in which the mapping logic maps multiple logical identifications to the physical identifications, where each logical identification includes the mapping of input and output signals of the repetitive functional blocks. In one embodiment, the mapping logic 206 (under control of the test logic 203) selects a functional block to be tested, redirects the input of the selected functional block to the SBF 205, transfers the state of the functional block to the SBF 205, and redirects the output of the selected functional block to the SBF 205, so that the SBF 205 continues normal operation of the selected functional block. The test logic 203 then performs the desired test operation. If and when the functional block passes testing thereby ensuring proper operation, the test logic 203 controls the mapping logic 206 to reverse the transfer procedure to transfer operations back to the regular functional block from the SBF 205. The SBF 205 is then available to test another functional block.

As further described below, several different methods are disclosed for transferring state information between the spare or test functional block and every other functional block for purposes of testing. Depending upon the particular configuration, the transfer may be done seamlessly during normal operation of the IC 101, with only relatively minimal delay, or during certain operating states or conditions. Testing is performed continuously over the life of the product in the target application. Rigorous testing methods may be used to achieve desired safety integration levels while in the target application, including, for example, pseudo-random test pattern generation (PSTPG) scan testing with multiple input signature registers (MISRs) for compressed results checking. A repetitive functional block testing system and method as described herein greatly reduces diagnostic software needs for safety critical applications. A repetitive functional block testing system and method enables replacement of faulty logic with known good logic. For example, in some embodiments, if a functional block fails, a spare functional block or another functional block may be used to replace the failed functional block. In other embodiments, additional replacement functional blocks (e.g. 2 or 3) may be included and used to replace a failed functional block to extend the life of the device. The addition of a few spare or replacement functional blocks is more silicon efficient than full (double or triple) redundancy of all functional blocks for all functional block types.

Figure 3:
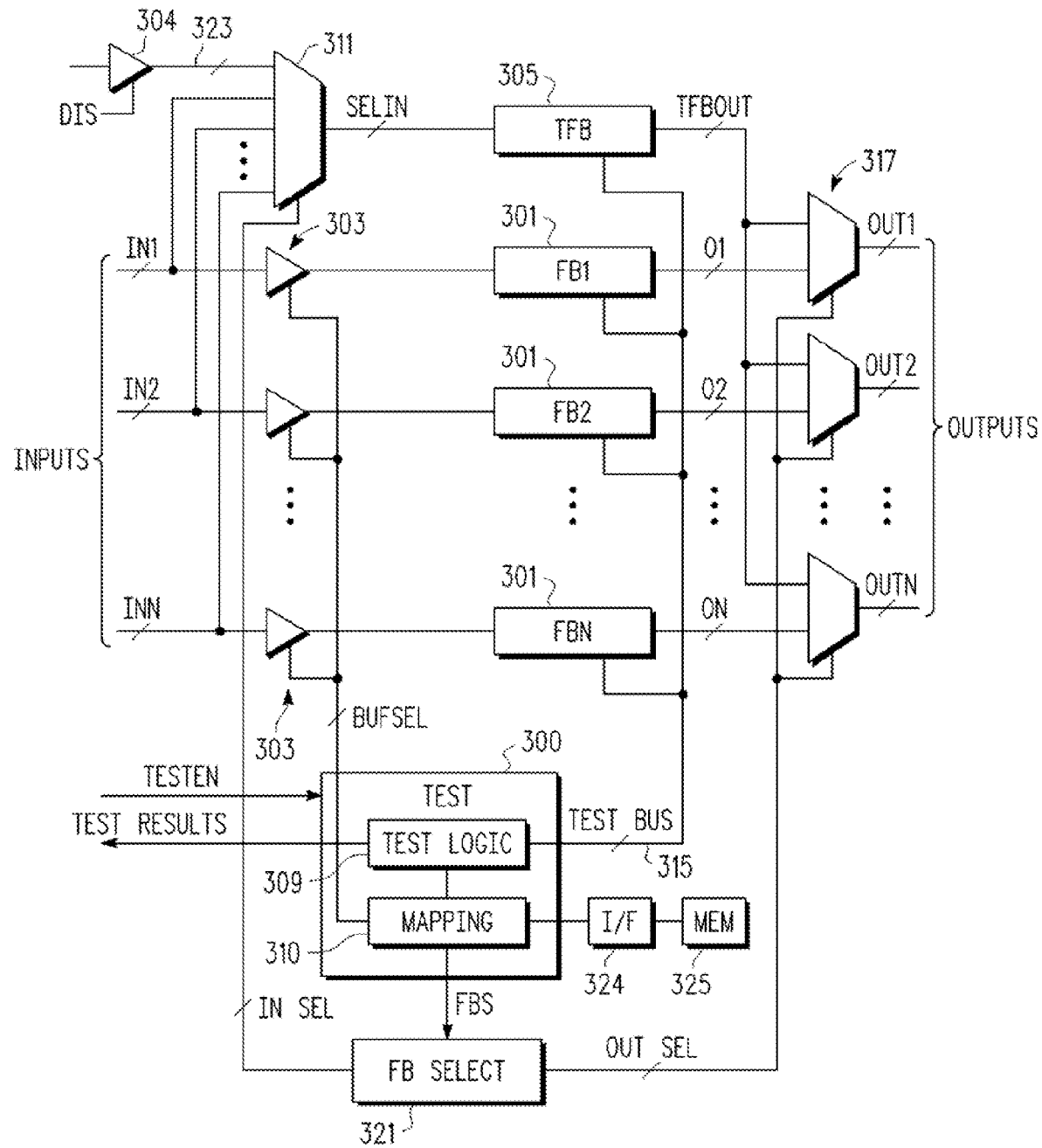
FIG. 3 is a schematic and block diagram of another functional block test system implemented according to a substitution test method embodiment which may be implemented on the IC of FIG. 1 and used for testing the repetitive functional blocks during normal functional mode of the IC.

FIG. 3 is a schematic and block diagram of another functional block test system implemented according to a substitution test method embodiment which may be implemented on the IC 101 and used for testing the repetitive functional blocks during normal functional mode of the IC 101. In this embodiment, the IC 101 includes a set of "N" functional blocks (FB) 301, individually labeled FB1, FB2, ..., FBN. The functional blocks 301 represent any one of the channels 102 or the processor cells 115 or any other type of functional blocks. Each of the functional blocks 301 is configured to receive a corresponding one of set of input signals IN1, IN2, ..., INN and to provide a corresponding one of a set of output signals O1, O2, ..., ON. Each of the input signals IN1-INN and the output signals O1-ON is shown as multiple signals, although it is understood that each signal may include one or more individual signal lines. The functional blocks 301 are each implemented in the same manner, yet each functional block is separately configurable (e.g., with configuration values and the like) to operate in accordance with the particular configuration. A test functional block (TFB) 305 is also included and is implemented in the same manner as each of the functional blocks 301, where the TFB 305 represents the spare functional block configured as a dedicated test functional block for test purposes. Each of the input signals IN1-INN is provided to an input of a respective one of a set of input buffers 303, in which each buffer 303 has an output coupled to the input of a corresponding one of the functional blocks 301. The control input of each of the buffers 303 is coupled to receive a corresponding one of a set of buffer select (BUFSEL) signals provided by test logic 309 of a test circuit 300. The input signals IN1-INN are also provided to respective inputs of another MUX 311, having an output providing a selected input signal (SELIN) to an input of the TFB 305. The output of the TFB 305 provides a test functional block output signal TFBOUT to a first input of each of a set of output MUXes 317. Each of the output signals O1, O2, ..., ON is provided to a corresponding second input of the output MUXes 317. Each output MUX 317 has an output providing a corresponding one of N output signals OUT1, OUT2, ..., OUTN.

A test bus 315 is also coupled to test interfaces of the TFB 305, each of the functional blocks 301 and to the test logic 309. The test bus 315 is independent of the normal inputs and outputs of the functional blocks 301 and is a special test interface including multiple test signals for conducting the appropriate test methodology for the functional blocks. In one embodiment, for example, the test bus 315 includes a test clock signal (TCK), a test enable signal (TE), a test mode select signal (TMS), a test data input signal (TDI), a test data output signal (TDO), etc., coupled between the test logic 309 and each of the functional blocks 301 and the TFB 305. In this manner, the test logic 309 is coupled to individually test any one of the functional blocks 301 or the TFB 305 while the remaining functional blocks remain operational and not affected. The test circuit 300 includes mapping logic 310 which is controlled by the test logic 309, where the mapping logic 310 provides functional block select (FBS) signals to write a value to functional block (FB) select logic 321. The FB select logic 321 provides input select (IN SEL) signals to the select input of the MUX 311, and provides output select (OUT SEL) signals to the select inputs of the MUXes 317. The test circuit 300 receives a test enable (TESTEN) signal and the test logic 309 provides test results via corresponding TEST RESULTS signals. In the embodiment illustrated, the MUX 311 includes an additional input receiving one or more input signal(s) 323 driven by corresponding one or more buffers 304 (shown as a single buffer). Each buffer 304 receives a disable (DIS) signal so that its output remains disabled as further described below.

During normal "pass-through" operation of each of the functional blocks 301, the corresponding buffer 303 is enabled so that the corresponding input signal INX (in which "X" denotes one of the functional block numbers 1-N) is provided to the corresponding functional block FBX having an output providing a corresponding output signal OX. The OX signal is selected by the corresponding output MUX 317 as the corresponding OUTX signal. For example, if FB1 is not selected for testing, then the IN1 signal is provided via the corresponding buffer 303 to the input of the functional block FB1, which provides the O1 signal at its output to a corresponding input of a corresponding MUX 317, which selects the O1 signal as the OUT1 signal during normal operation. The test logic 309 controls the mapping logic 310 to select one of the functional blocks 301 for test and provides the FBS signal to write a value indicating the selected functional block to the FB select logic 321. The FB select logic 321 provides the IN SEL signal to control the MUX 311 to select the corresponding INX signal of the selected functional block as the SELIN signal provided to the input of the TFB 305. Also, the FB select logic 321 provides the OUT SEL signal to control the corresponding MUX 317 to select the corresponding TFBOUT signal from the TFB 305 instead of the OX signal from the selected functional block. For example, if the FBS signal indicates FB2 as the selected functional block, then the IN SEL signal controls the MUX 311 to select the IN2 signal as the SELIN signal provided to the input of the TFB 305. Furthermore, the OUT SEL signal controls the MUX 317 associated with FB2 to select the TFBOUT signal rather than the O2 signal as the OUT2 signal. In this manner, the TFB 305 is effectively substituted for the selected functional block (e.g., FB2). The mapping logic 310 asserts the BUFSEL signals to disable the corresponding buffer 303 to isolate the normal input from the selected functional block. The test logic 309 then tests the selected functional block via the test bus 315 and outputs the TEST RESULTS. The TFB 305 may also be selected for test, in which case the MUX 311 selects the signals 323 and the TFBOUT signal is ignored (e.g., not selected by any of the MUXes 317).

Each time the IC 101 is powered-up or reset, upon exit of reset and prior to initialization of the functional blocks 301, the TESTEN signal is provided to the test circuit 300 to initiate testing of a selected functional block. In one embodiment, the TESTEN signal is related to or otherwise derived from a reset signal of the IC 101. The TESTEN signal may also be permanently disabled (e.g., held to a logic zero level) if for any reason it is desired to permanently disable testing for a particular configuration. In response to assertion of the TESTEN signal, the mapping logic 310 writes a value to the FB select logic 321 indicating the selected functional block. In one embodiment, a value "0" selects the TFB 305 for test, a value "1" selects the first functional block FB1 for test, a value 2 selects the second functional block FB2 for test, and so on up to a value "N" for selecting the last functional block FBN for test. It is noted that for the substitution test method, only one functional block is tested at a time for each power-up or reset event and the next functional block is not tested until after the next power-up or reset event. Although each of the functional blocks 301 are implemented in substantially the same manner, each is separately configured after initialization to operate in a selected manner that may be different from the configuration and operation of another functional block. In this manner, just after reset and before specific configuration (or individual initialization) of each of the functional blocks 301 when all of the functional blocks 301 and the TFB 305 are essentially in identical states, a functional block is selected for testing and the TFB 305 is substituted for the selected functional block. One test cycle per reset event is acceptable for most configurations since the IC 101 is reset many times during its expected life cycle ensuring that all of the functional blocks 301 and the TFB 305 are continuously tested.

Various methods are provided for selecting the next functional block to be tested. In the embodiment illustrated, the mapping logic 310 is coupled to or otherwise has access to a programmable nonvolatile memory device 325, such as an electrically erasable programmable read-only memory (EEPROM) or a flash memory device or the like, for storing a value indicating either the last functional block tested or the next functional block to be tested. For example, if the TESTEN signal indicates testing is enabled, the mapping logic 310 reads a value from the programmable nonvolatile memory device 325 indicating the last functional block tested, modifies the retrieved value to select a different functional block to be tested in the current iteration, and writes the new value to the FB select logic 321 via the FBS signals. The new value is also eventually written back to the programmable nonvolatile memory device 325 to ensure that a new functional block is selected upon the next initialization event. In one embodiment, for example, the mapping logic 310 increments the retrieved value up to the value N and then back to 0 (e.g., modulo function or the like) to implement a round-robin selection scheme for testing the TFB 305 and the functional blocks 301 in numeric order. Alternative methods are contemplated, such as random or pseudo-random selection techniques and the like. The programmable nonvolatile memory device 325 is accessed via a memory interface 324. In one embodiment, the nonvolatile memory device 325 is integrated onto the IC 101. In an alternative embodiment, the memory interface 324 is an external interface of the IC 101, such as including one or more pins of the IC 101 and associated logic or circuitry, and the nonvolatile memory device 325 is an external device coupled to or otherwise made available to the IC 101.

Figure 4:
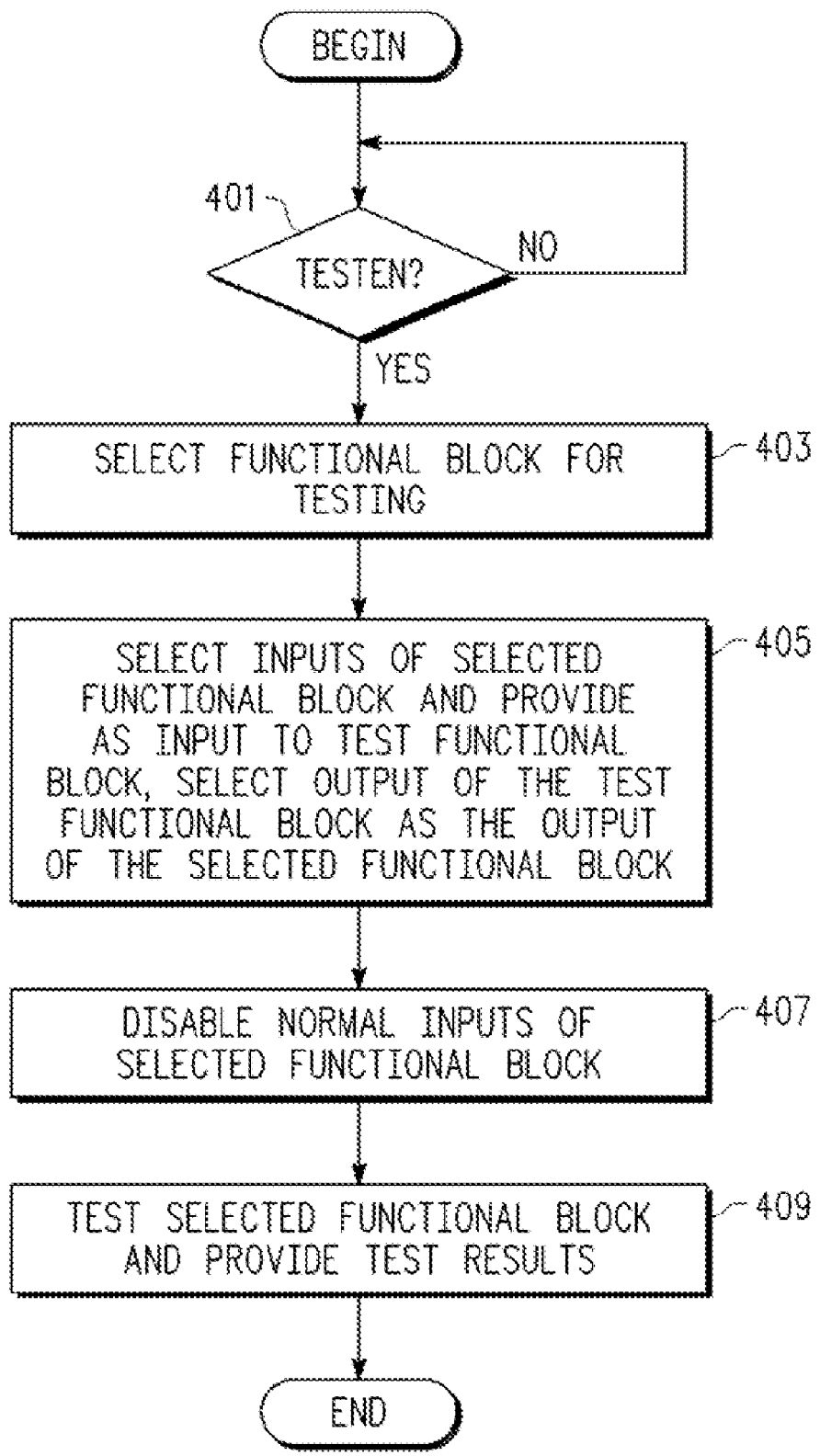
FIG. 4 is a flowchart diagram illustrating operation of the functional block test system of FIG. 3 according to an exemplary embodiment for performing the substitution test method during normal functional mode of the IC.

FIG. 4 is a flowchart diagram illustrating operation of the functional block test system of FIG. 3 according to an exemplary embodiment for performing the substitution test method during normal functional mode of the IC 101. Operation begins at a first block 401 to query the TESTEN signal. When the TESTEN signal is asserted (e.g., after reset), operation proceeds to block 403 in which a functional block is selected for testing. As previously described, in one embodiment, the mapping logic 310 retrieves a stored value indicating the last functional block tested (or the next functional block to be tested), and writes a new value to the FB select logic 321 to select the next functional block for testing. At next block 405, the inputs of the selected functional block are selected and provided as the input to the TFB 305 via the MUX 311, and the TFBOUT signal at the output of the TFB 305 is selected by the corresponding MUX 317 as the output OUTX of the selected functional block (instead of the normal OX output of the selected functional block). At next block 407, the test logic 309 controls the mapping logic 310 to disable the normal inputs of the selected functional block via a corresponding buffer 303 to isolate the selected functional block. At next block 409, the test logic 309 begins the testing procedure via the test bus 315 and provides the TEST RESULTS. It is noted that initialization of the functional blocks 301 begins at any time after 407 including while the selected functional block is being tested. Operation is repeated upon the next reset event.

Figure 5:
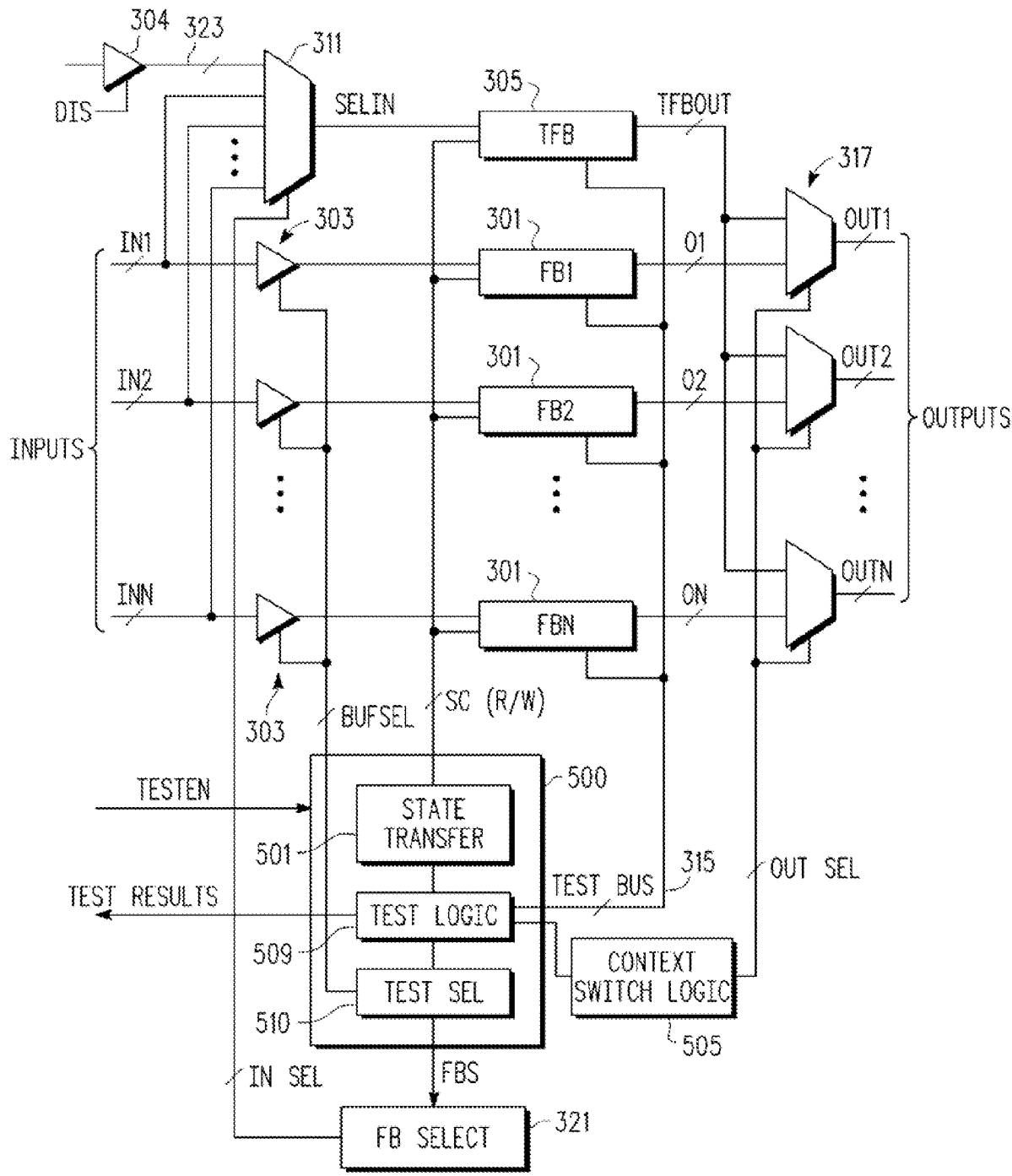
FIG. 5 is a schematic and block diagram of a functional block test system implemented according to another embodiment for performing a shadow substitution test method which may be implemented on the IC of FIG. 1 and used for continuous testing repetitive functional blocks during normal functional mode of the IC.

FIG. 5 is a schematic and block diagram of a functional block test system implemented according to another embodiment for performing a shadow substitution test method which may be implemented on the IC 101 and used for continuous testing repetitive functional blocks during normal functional mode of the IC 101. The functional block test system of FIG. 5 is similar to the functional block test system of FIG. 3 in which similar components assume identical reference numbers. The functional blocks 301 and the TFB 305, the buffers 303 and 304, the MUX 311, the FB select logic 321 and the output MUXes 317 are included and operate in substantially the same manner as previously described. The MUX 311 has an input coupled to the signal line(s) 323 driven by the output of the disabled buffer 304 in a similar manner as previously described. The test bus 315 is included and coupled to the test interfaces of the TFB 305 and each of the functional blocks 301. The test circuit 300 is replaced with a test circuit 500, which includes test logic 509 coupled to control state transfer logic 501 and test select logic 510. The test select logic 510 provides the BUFSEL signals to control the buffers 303 for providing the IN1-INN input signals to, or isolating the input signals from, the functional blocks 301. A state control (SC) bus 503 is coupled between the state transfer logic 501 and each of the functional blocks 301 and the TFB 305. The SC bus 503 is a read/write (R/W) bus used by the state transfer logic 501 for transferring state information as further described below. The mapping function is distributed among the state transfer logic 501, the test select logic 510 and context switch logic 505. The test circuit 500 receives the TESTEN signal to enable testing and the test logic 509 is coupled to the test bus 315 and provides the TEST RESULTS. In this case the TESTEN signal is asserted during normal operation of the IC 101 to enable operation of the test circuit 500 and is not necessarily based on the reset or power-up functions. The functional block test system of FIG. 5 further includes the context switch logic 505 coupled to the test logic 509 and providing the OUT SEL signals to control the MUXes 317.

The state transfer logic 501 operates to read state information from a first functional block and to write the state information to a second functional block via the SC bus 503 to effectively transfer state from the first functional block to the second functional block. In one embodiment, this memory-mapped copy process is done using an atomic method to ensure coherency between the first and second functional blocks. When a functional block 301 is selected for testing, the state of the selected functional block is transferred to the TFB 305 by the state transfer logic 501 via the SC bus 503. The input of the selected functional block is selected as the SELIN signal provided to the input of the TFB 305, so that the TFB 305 effectively shadows operation of the selected functional block. The context switch logic 505 determines when to switch operation from the selected functional block to the TFB 305 and then asserts the OUT SEL signals to switch the outputs. Once switched, the TFB 305 is substituted for the selected functional block, so that the selected functional block is available for testing by the test logic 509 in a similar manner as previously described. After testing and assuming testing is successful, the procedure is reversed to switch operation from the TFB 305 back to the tested functional block.

The shadow substitution test method enables the functional blocks 301 and the TFB 305 to be continuously tested during normal operation without waiting for the next reset or power-up event as was described for the substitution test method. In particular, the state transfer logic 501 enables transfer of the state of the selected functional block to the TFB 305 and back again during normal operation, so that there is no need to wait until the next reset event to begin testing another functional block. In this case, the test logic 509 does not rely on a programmable nonvolatile memory device (e.g., memory device 325) but instead operates independently to select the functional blocks for testing according to any suitable selection method, such as round-robin or any suitable random or pseudo-random method. For example, since each of the functional blocks 301 and the TFB 305 may be tested during normal operation, the test logic 509 may be configured to initially select the same functional block for test after each reset or power-up event. It is noted that when the TFB 305 is selected for testing, there is no need to transfer state so that the test logic 509 may begin the test procedure immediately.

Figure 6:
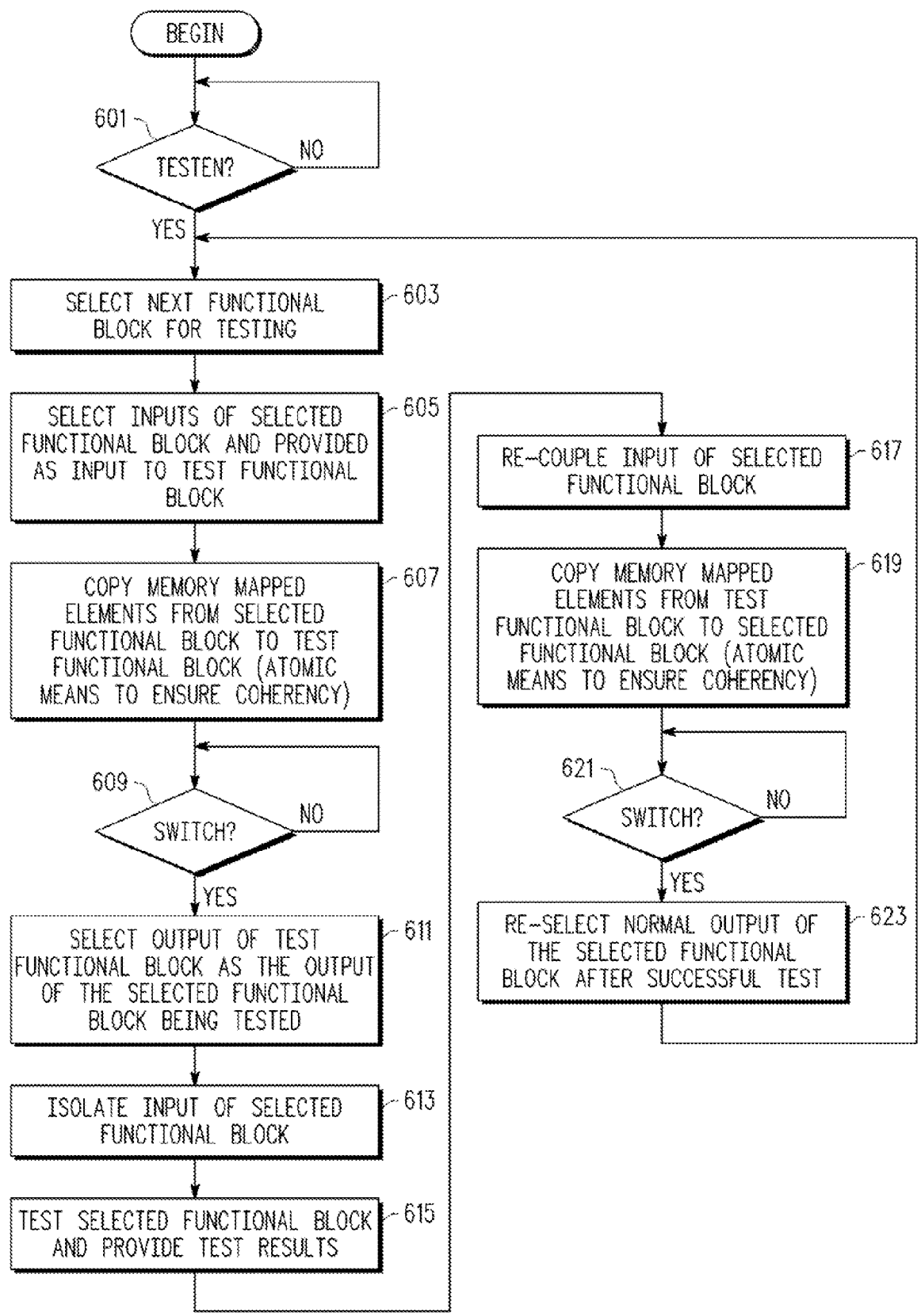
FIG. 6 is a flowchart diagram illustrating operation of the functional block test system of FIG. 5 according to an exemplary embodiment for performing the shadow substitution test method during normal functional mode of the IC.

FIG. 6 is a flowchart diagram illustrating operation of the functional block test system of FIG. 5 according to an exemplary embodiment for performing the shadow substitution test method during normal functional mode of the IC 101. Operation begins at first block 601 in which the TESTEN signal is queried to determine whether testing is enabled. In an actual configuration, if the TESTEN signal is not asserted so that testing is disabled, no testing operations are performed. Assuming the TESTEN signal indicates that testing is enabled, operation proceeds to block 603 in which the next functional block for testing is selected by the test logic 509 and indicated to the test select logic 510. At block 603, the test select logic 510 writes a value to the FB select logic 321 indicating the selected functional block. At next block 605, the FB select logic 321 asserts the IN SEL signals to control the MUX 311 to select the inputs of the selected functional block as the SELIN signal provided to the input of the TFB 305. At next block 607, the state transfer logic 501 of the test circuit 500 copies the memory mapped elements from the selected functional block to the TFB 305 via the SC bus 503 to transfer state information. The memory mapped copy process is done using an atomic method to ensure coherency between the selected functional block and the TFB 305. At this point, the TFB 305 shadows operation of the selected functional block. In one embodiment, the state transfer logic 501 copies and transfers the state of each and every memory device between the substantially identical functional blocks. In an alternative embodiment, a portion of state information is copied, in which the subset includes those state in critical logic paths or devices.

After the state information of the selected functional block is copied to the TFB 305, the test logic 509 informs the context switch logic 505, which employs a selected criterion to determine when to switch operation from the selected functional block to the TFB 305 as indicated at block 609. In one embodiment, the context switch logic 505 waits a predetermined delay period, such as a predetermined number of clock cycles, and then informs the test logic 509 to switch operation. When the context switch logic 505 indicates switching at block 609, operation proceeds to next block 611 in which the context switch logic 505 asserts the OUT SEL signal to control the MUXes 317 to select the TFBOUT output of the TFB 305 as the output of the selected functional block being tested. At this point, the TFB 305 is substituted for the selected functional block, which is now available for testing. At next block 613, the test select logic 510 asserts the BUFSEL signals to disable the buffer 303 associated with the selected functional block to isolate the input from the selected functional block. At next block 615, the test logic 509 performs the test procedure via the test bus 315 and provides the TEST RESULTS.

After the test is performed, state information is transferred back to the selected functional block by reversing the transfer process. In particular, operation proceeds to block 617 in which the test select logic 510 asserts the BUFSEL signal to re-enable the buffer 303 of the selected functional block to re-couple the input of the selected functional block (e.g., couple the corresponding one of the inputs IN1-INN to the selected one of the functional blocks FB1-FBN). Operation then proceeds to block 619, in which the state transfer logic 501 copies the memory mapped elements from the TFB 305 to the selected functional block via the SC bus 503. Again, the memory mapped copy process is done using an atomic method to ensure coherency between the TFB 305 and the selected functional block just tested. Operation then proceeds to block 621 to wait for the context switch logic 505 to indicate switching back to the tested functional block. When switching is indicated, operation proceeds to block 623 in which the context switch logic 505 controls the OUT SEL signals to re-select the normal output OX of the successfully tested functional block as the OUTX signal of the corresponding MUX 317. Operation then proceeds back to block 603 to select another functional block 301 for testing.

It is noted that if testing is unsuccessful for any one of the functional blocks 301, an external indication may be provided and the continual testing procedure may be halted. If the TFB 305 is selected for testing at block 603, then blocks 605-613 may be skipped or bypassed and testing of the TFB 305 at block 615 may begin immediately. After successful testing of the TFB 615, operation returns to block 603 (skipping blocks 617-623) to select the next functional block.

Figure 7:
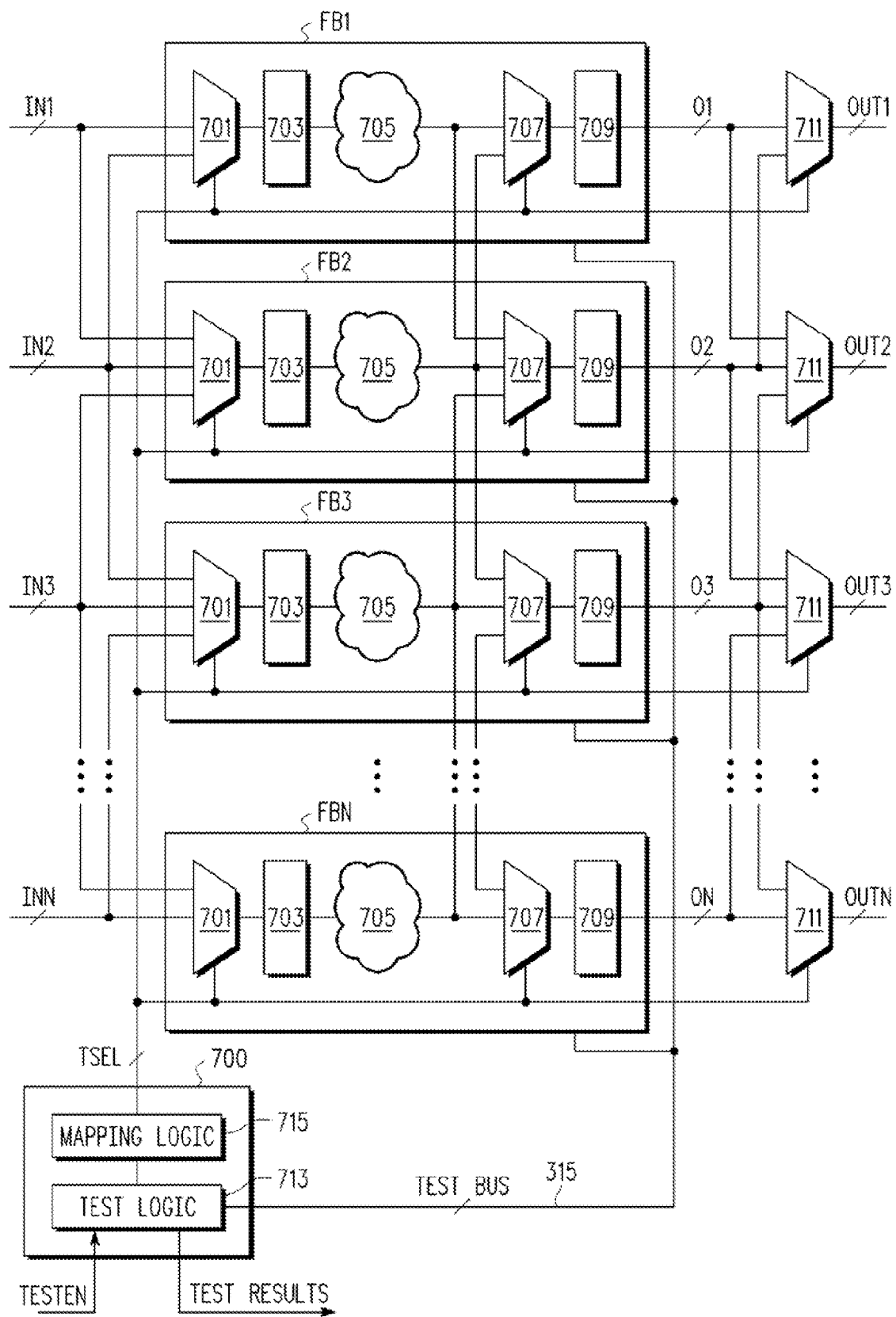
FIG. 7 is a schematic and block diagram of a functional block test system implemented according to another embodiment for performing a shift test method which may be implemented on the IC of FIG. 1 and used for continuous testing repetitive functional blocks during normal functional mode of the IC.

FIG. 7 is a schematic and block diagram of a functional block test system implemented according to another embodiment for performing a shift test method which may be implemented on the IC 101 and used for continuous testing repetitive functional blocks during normal functional mode of the IC 101. The functional block test system of FIG. 7 includes a number "N" functional blocks individually labeled FB1, FB2, FB3, ..., FBN. The functional blocks FB1-FBN are each implemented in substantially the same manner and are illustrated in simplified form. As shown, each functional block includes an input MUX 701 having an input receiving a corresponding one of the input signals IN1-INN, and an output coupled to an input of a first storage device 703, such as a D-type flip-flop (DFF) or the like. The first storage device 703 has an output coupled to an input of combinatorial logic 705. The combinatorial logic 705 has an output coupled to an input of an intermediate MUX 707, having an output coupled to an input of a second storage device 409, such as a DFF or the like, which has an output providing a corresponding one of N output signals O1-ON. Each of the output signals O1-ON is provided to an input of a corresponding one of N output MUXes 711, which provide N output signals OUT1-OUTN in a similar manner as previously described. It is appreciated the each of the input signals IN1-INN may include any number of input signals (one or more) provided to multiple input MUXes 701 within each of the functional blocks. Also, each functional block may include multiple signal lines and any number of intermediate stages and corresponding synchronous or asynchronous storage devices, any number of combinatorial logic portions, and any corresponding number of intermediate multiplexers as understood by those of ordinary skill in the art.

The functional block test system of FIG. 7 includes a test circuit 700 which includes test logic 713 coupled to mapping logic 715. The test logic 713 is coupled to the test bus 315, which is further coupled to each of the functional blocks FB1-FBN. The test logic 713 individually tests each of the functional blocks FB1-FBN via the test bus 315 in substantially the same manner previously described. The mapping logic 715 provides test select signals TSEL to control inputs of each of the MUXes 701, 707, and 711 of each of the functional blocks FB1-FBN. Although the TSEL signals are shown as a common group of signals provided to each of the MUXes 701, 707, and 711, the signals are distributed to provide independent control of each MUX. The test logic 713 also includes an input for receiving the TESTEN signal and an output providing TEST RESULTS.

In the functional block test system of FIG. 7, each of the input signals IN1-INN is provided to the input MUX 701 of at least one adjacent functional block. For example, the input signal IN2 for the functional block FB2 is provided to the input MUXes 701 of functional blocks FB1 and FB3, the input signal IN3 for the functional block FB3 is provided to the input MUXes 701 of functional blocks FB2 and FB4 (not shown), and so on. In the illustrated embodiment, the first and last functional blocks FB1 and FBN are not considered adjacent to each other so that the input signal IN1 is only provided to the input MUXes 701 of FB1 and FB2 and the input signal INN is only provided to the input MUXes 701 of FBN-1 (not shown) and FBN. In an alternative embodiment, the functional blocks FB1 and FBN are considered adjacent to each other so that the input signal IN1 is provided to the input MUXes 701 of FB1, FB2 and FBN and the input signal INN is provided to the input MUXes 701 of FBN-1, FBN and FB1. Also, the output of each combinatorial logic 705 within each functional block FB1-FBN is provided to an input of the intermediate MUXes 707 of adjacent functional blocks. Thus, the output of logic 705 of functional block FB2 is provided to an input of the MUX 707 of functional blocks FB1 and FB3, the output of combinatorial logic 705 of functional block FB3 is provided to an input of the MUX 707 of functional blocks FB2 and FB4, and so on. Furthermore, the output signals O1-ON are each provided to an input of the output MUXes 711 of adjacent functional blocks. Thus, the output signal O2 is provided to an input of the output MUXes 711 of functional blocks FB1 and FB3, the output signal O3 is provided to an input of the output MUxes 711 of functional blocks FB2 and FB4, and so on. The MUXes associated with each functional block, e.g., MUXes 701, 707, 711, etc., collectively form adjacent select logic controlled by the mapping logic 715.

In the functional block test system of FIG. 7, the TESTEN signal provided to the test logic 713 enables or disables continuous testing of the functional blocks FB1-FBN. If the TESTEN signal is not asserted indicating testing is disabled, then all of the functional blocks FB1-FBN are available for normal use without testing. When the TESTEN signal is asserted, N-1 of the functional blocks are available for normal operations, and one functional block is a "spare functional block" which is available to operated as a test functional block for an adjacent functional block at any given time. If testing is enabled, upon power-up or reset, any one of the functional blocks FB1-FBN is initially selected as the spare functional block and is available to test an adjacent functional block (on either side depending upon routing configuration) selected for test. After a functional block is tested and assuming it successfully passes testing, that functional block is available to test another adjacent functional block, and so on. In one embodiment, the test logic 713 is configured to step through the functional blocks one at a time and in a continuous manner. In the shift test method implemented according to that shown in FIG. 7, the test functional block is not dedicated but is shifted from one functional block to the next.

Figure 8:
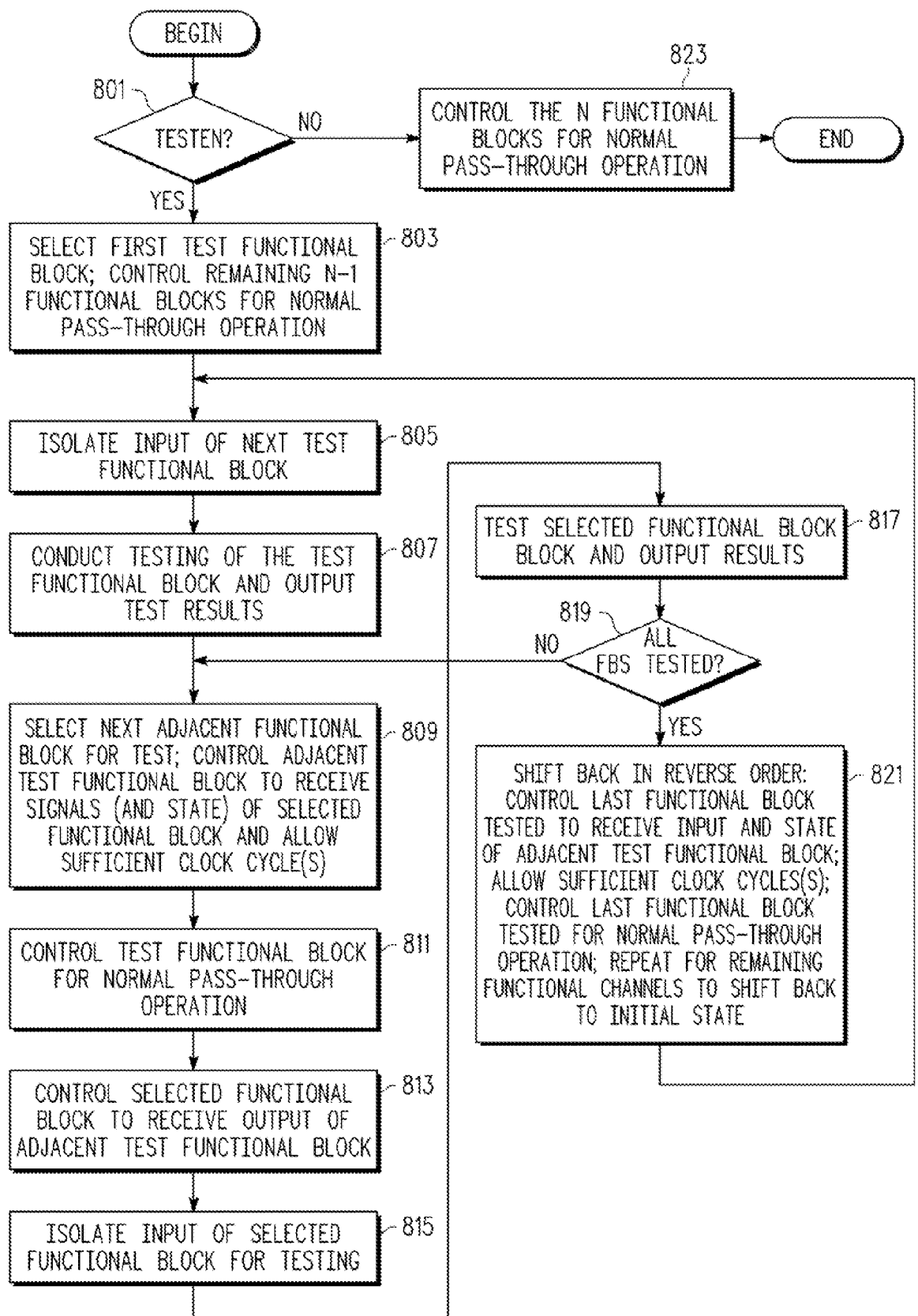
FIG. 8 is a flowchart diagram illustrating operation of the functional block test system of FIG. 7 according to an exemplary embodiment for performing the shift test method during normal functional mode of the IC.

FIG. 8 is a flowchart diagram illustrating operation of the functional block test system of FIG. 7 according to an exemplary embodiment for performing the shift test method. After power-up or reset, the TESTEN signal is queried at first block 801 to determine whether testing is enabled during normal functional mode of the IC 101. If testing is not enabled as indicated by the TESTEN signal, then operation proceeds to block 823 in which the input, intermediate and output MUXes 701, 707, and 711 of each of the N functional blocks FB1-FBN are controlled for normal pass-through operation and. In FB1, for example, MUX 701 selects IN1, MUX 707 selects the output of the combinatorial logic 705 of FB1, and MUX 711 selects O1 as OUT1. In this manner, the N functional blocks are available for normal operations without testing. If instead TESTEN is asserted at block 801, then operation proceeds to block 803 in which any one of the functional blocks is selected as the "first" test functional block and the remaining N-1 functional blocks are considered normal "operational" functional blocks. The MUXes of the remaining N-1 operational functional blocks are controlled for normal "pass-through" operation. The test logic 713 selects (via the mapping logic 715) any arbitrary functional block as the first test functional block. For example, if the first functional block FB1 is selected as the first test functional block, then the functional blocks FB2-FBN are considered the normal operational functional blocks. For normal pass-through operation, IN2 is processed through FB2 to provide O2 as OUT2, IN3 is processed through FB3 to provide O3 as OUT3, and so on up to the last functional block FBN in which INN is processed through FBN to provide ON as OUTN.

At next block 805, the input of the "next" test functional block is isolated to prepare it for testing. In the first iteration, the "next" test functional block is still the first test functional block selected by the test logic 713. Although not shown, buffers similar to the buffers 303 or other isolating devices may be provided to isolate the inputs of each functional block to avoid external signals from interfering with test procedures. Operation then proceeds to next block 807 in which the test logic 713 performs testing of the test functional block via the test bus 315 and outputs TEST RESULTS. Although not shown, if the test functional block fails testing, then a separate error handling procedure is performed, such as providing an external indication of the failure and possible shut-down of the IC 101. If the test functional block passes testing, operation proceeds to block 809 in which the next adjacent functional block is selected for testing. For example, if the first functional block FB1 is initially the first test functional block which has just passed testing, then it becomes the next test functional block substituted for the next adjacent functional block FB2, which becomes the selected functional block for testing. At block 809, the input and intermediate MUXes of the test functional block are controlled to select the input and state signals of the selected functional block and operation waits a sufficient number of clock cycles to ensure that the test functional block duplicates operation of the selected functional block. For example, if the first functional block FB1 is the first test functional block and the second functional block FB2 is the selected functional block for testing, then the MUXes 701 and 707 of FB1 are controlled to select IN2 and the output of the combinatorial logic 705 of FB2. The number of sufficient clock cycles depends on the particular type and implementation of the functional blocks. In many cases, a single clock cycle is sufficient. In more sophisticated configurations, two or more clock cycles may be used to ensure that the test functional block fully shadows the state and operation of the selected functional block.

After the wait period (one or more clock cycles), the test functional block assumes the same state and operation as the selected functional block in a seamless manner since operation of the selected functional block is not changed or affected. At next block 811, the intermediate MUX 707 of the test functional block is controlled by the mapping logic 715 for normal pass-through operation so that the test functional block now mimics operation of the selected functional block. At next block 813, the output MUX 711 of the selected functional block is controlled by the mapping logic 715 to receive the output signal OX (e.g., O1) of the test functional block. This effectively transfers state from the selected functional block to the test functional block, so that the test functional block is effectively substituted for the selected functional block. For example, assuming FB1 is the test functional block and FB2 is the selected functional block, input signal IN2 is received and processed through FB1 to develop the output signal O1, which is selected by output MUX 711 of FB2 as the output signal OUT2. The switch from the test functional block to the adjacent selected functional block is seamless since operation of FB2 remains unaffected.

At next block 815, the input of the selected functional block is isolated in a similar manner as previously described, and the selected functional block is tested via the test bus 315 and the TEST RESULTS are provided at next block 817. At next block 819, it is queried whether all functional blocks (FBS) have been tested. If not, operation returns to block 809 to select the next adjacent functional block for test. For example, if FB1 was the test functional block and FB2 was the selected functional block that was just tested, FB2 is now available as the test functional block and next adjacent functional block FB3 is selected as the next functional block to be tested. Operation loops through blocks 809 to 819 until each of the functional blocks has been tested by the test logic 713.

After each of the functional blocks has been tested, operation advances to next block 821 to shift operation in reverse order back to the initial state. It is noted that up to this point, the operation of each functional block has been shifted to an adjacent test functional block to facilitate testing. For example, if FB1 was the original test functional block, after the functional blocks FB1-FBN have been tested (and assuming all have passed testing), then FB1 handles operations of FB2, FB2 handles operations for FB3, and so on up to FBN-1, which handles operations for FBN, which becomes the last test functional block. In order to shift back control in reverse order, the input MUX 701 of the last functional block tested (e.g., FBN) is controlled to receive its own input (e.g., input INN) and the intermediate MUX 707 of the last functional block tested is controlled to transfer state of the last test functional block (e.g., FBN−1) and these MUXes are held for a sufficient number of clock cycles so that both functional blocks have equal states. Then the intermediate MUX 707 and output MUX 711 of the last functional block tested (e.g., FBN) are controlled for normal pass-through operation so that the last functional block tested now resumes normal pass-through operation for its own input and output signals. The last test functional block (e.g., FBN−1) is now available to recover its own operations from its other adjacent functional block, and operation is repeated in reverse order to return to the initial state in which the first test functional block is once again the test functional block.

In the illustrated embodiment, after each of the functional blocks FB1-FBN have been tested and state information is shifted back to the original state upon power-up or reset, operation returns back to block 805 to isolate the input of the current test functional block. Operation loops between blocks 805-821 to continuously test each of the functional blocks in shift order. In an alternative embodiment, operation terminates after all functional blocks have been tested, such as after block 819 or after the shift back process. In the alternative embodiment, testing resumes after the IC 101 is powered back up or otherwise reset so that continuous testing is still performed over the life of the IC 101.

Figure 9:
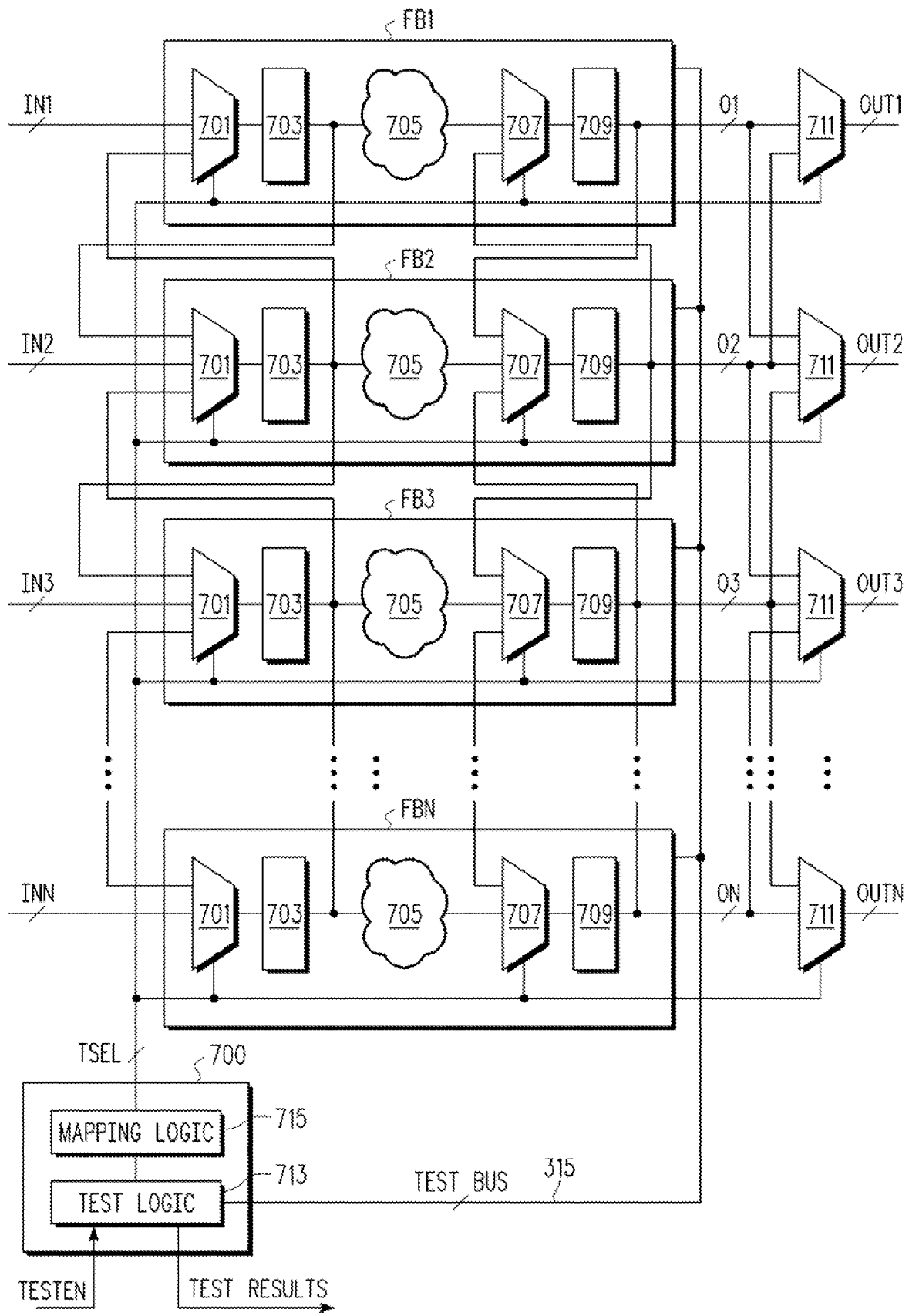
FIG. 9 is a schematic and block diagram of a functional block test system implemented according to another embodiment for performing a delayed shift test method which may be implemented on the IC of FIG. 1 and used for continuous testing of repetitive functional blocks during normal functional mode of the IC.

FIG. 9 is a schematic and block diagram of a functional block test system implemented according to another embodiment for performing a delayed shift test method which may be implemented on the IC 101 and used for continuous testing of repetitive functional blocks during normal functional mode of the IC 101. The functional block test system of FIG. 9 is substantially similar to the functional block test system of FIG. 7 in which similar components assume identical reference numbers. The test circuit 700 includes test logic 713 coupled to mapping logic 715 and operates in a substantially similar manner. In this case, the input signals IN1-INN and the outputs of the combinatorial logic 705 are not distributed to adjacent functional blocks. Instead the outputs of the first and second storage devices 703 and 709 are provided to adjacent functional blocks. In particular, the output of the first storage device 703 of each functional block is provided to respective inputs of input MUXes 701 of adjacent functional blocks and the output of the second storage device 709 is provided to respective inputs of intermediate MUXes 707 of adjacent functional blocks. The first and last functional blocks FB1 and FBN are not considered adjacent in the illustrated embodiment, but may be coupled as adjacent functional blocks in a similar manner in an alternative embodiment. Operation of the functional block test system of FIG. 9 is substantially similar to the operation of the functional block test system of FIG. 7 (as described in the flowchart of FIG. 8) except that the transfer of operational function between adjacent functional blocks occurs with an additional delay period (e.g., additional clock cycle(s)) to clock states through the storage devices 703 and 709.

Figure 10:
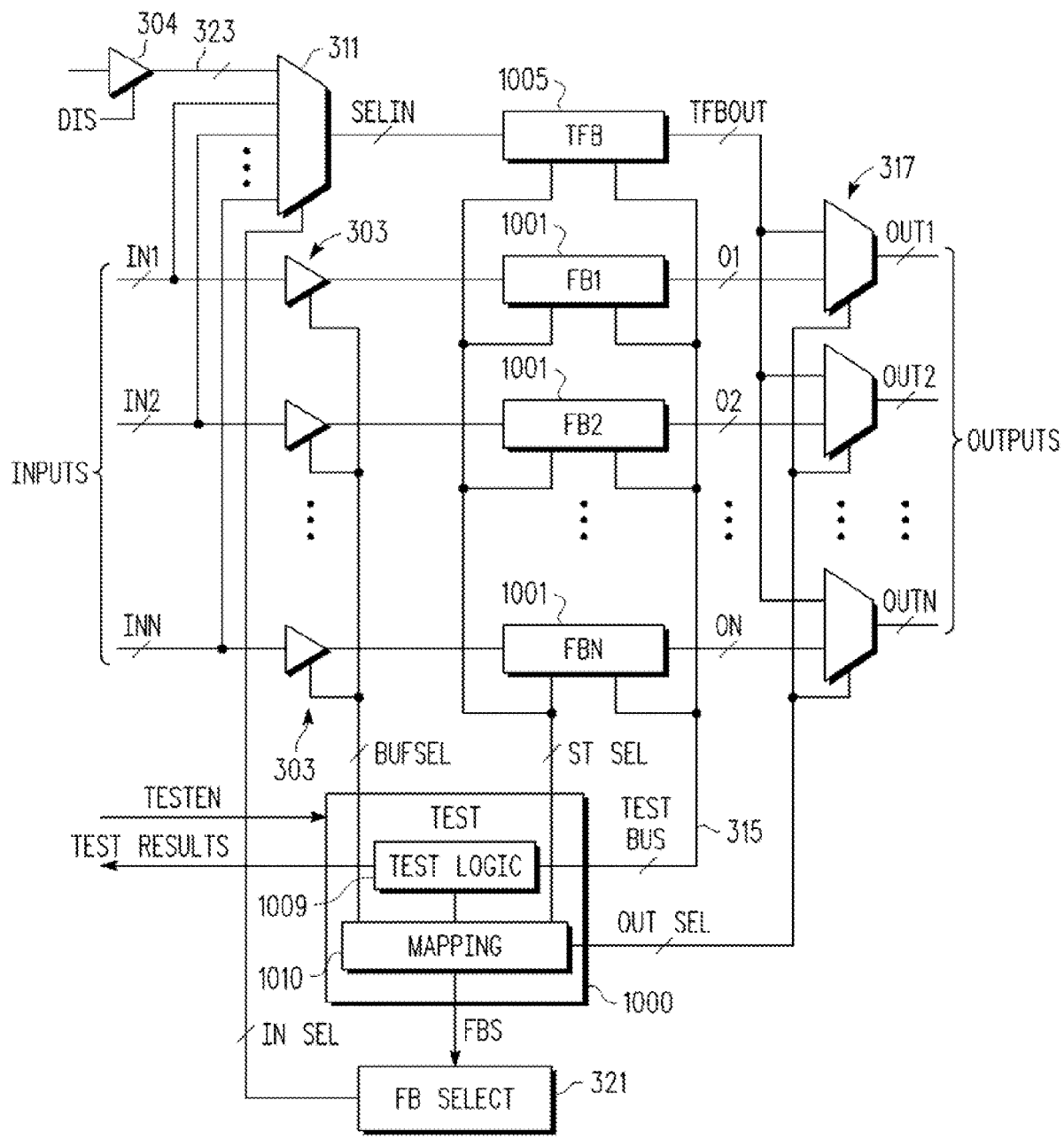
FIG. 10 is a schematic and block diagram of a functional block test system implemented according to another embodiment for performing a second substitution test method which may be implemented on the IC of FIG. 1 and used for continuous testing of repetitive functional blocks during normal functional mode of the IC.

FIG. 10 is a schematic and block diagram of a functional block test system implemented according to another embodiment for performing a second substitution test method which may be implemented on the IC 101 for continuous testing of repetitive functional blocks during normal functional mode of the IC. The functional block test system of FIG. 10 includes similar components as the functional block test circuits of FIGS. 3 and 5 in which similar components assume identical reference numbers. The buffers 303 and 304, the MUX 311, the FB select logic 321 and the output MUXes 317 are included and operate in substantially the same manner as previously described. The MUX 311 has an input coupled to the signal line(s) 323 driven by the output of the disabled buffer 304 in a similar manner as previously described. The N functional blocks 301 are replaced with similar functional blocks FB1-FBN 1001 and the TFB 305 is replaced with similar TFB 1005, which is a similar dedicated test functional block. The test circuit 300 is replaced with a test circuit 1000 which includes test logic 1009 coupled to mapping logic 1010. The mapping logic 1010 provides the BUFSEL signals to control the buffers 303 for providing the IN1-INN input signals to, or isolating the input signals from, the functional blocks 1001. A set of state select (ST SEL) signals are provided from the mapping logic 1010 and provided to each of the functional blocks 1001 and the TFB 1005 as further described below. The test circuit 1000 receives the TESTEN signal for enabling continuous testing functions, in which the test logic 1009 tests the selected functional block via the test bus 315, and provides the TEST RESULTS in a similar manner as previously described. The test logic 1009 selects a functional block for testing and controls the mapping logic 1010 to write a corresponding value via the FBS signals to the FB select logic 321, which provides the IN SEL signals to select the corresponding input signal as the SELIN signal provided to the TFB 1005. The mapping logic 1010 asserts the ST SEL signals to transfer intermediate states from the selected functional block to the TFB 1005 and vice-versa as described further below. The mapping logic 1010 controls the OUT SEL signals to control the output MUXes 317 in a similar manner as previously described.

Figure 11:
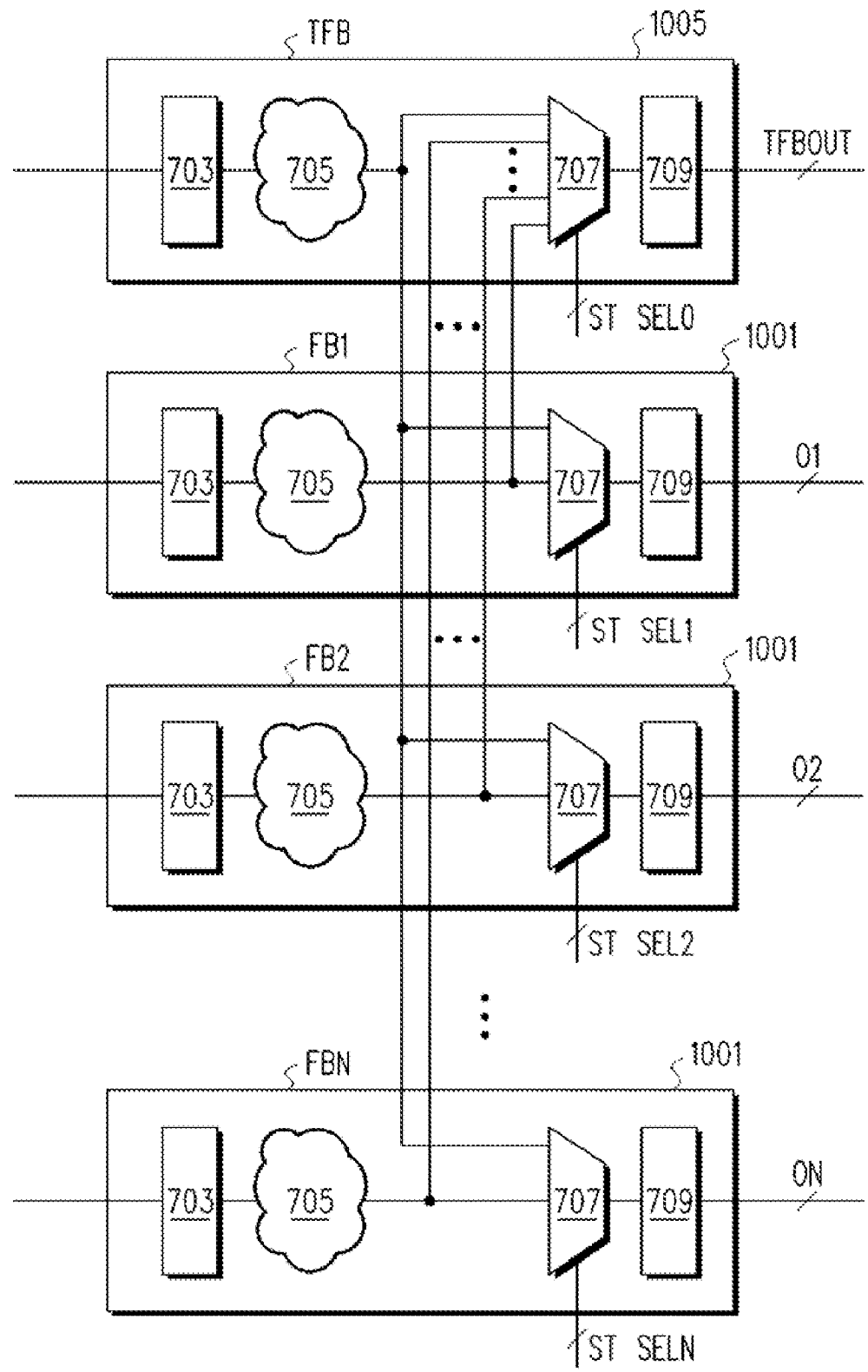
FIG. 11 is a more detailed schematic and block diagram of the test functional block and each of the functional blocks of the functional block test system of FIG. 10.

FIG. 11 is a more detailed schematic and block diagram of the TFB 1005 and each of the functional blocks 1001 of the functional block test system of FIG. 10. The TFB 1005 and each of the functional blocks 1001 are configured in a similar manner as the functional blocks FB1-FBN of the functional block test system of FIG. 7 excluding the input MUXes 701. In this case, the outputs of the buffers 303 are provided to the inputs of respective ones of the first storage devices 703 within the TFB 1005 and each of the functional blocks 1001. The outputs of the first storage devices 703 are provided to inputs of respective combinatorial logic 705, each having outputs provided to inputs of corresponding intermediate MUXes 707 within the TFB 1005 and each of the functional blocks 1001 in a similar manner as previously described. The outputs of the intermediate MUXes 707 are coupled to inputs of corresponding second storage devices 709, having outputs providing the output signals O1-ON. In this case, the output of the combinatorial logic 705 of the TFB 1005 is provided to one input of each of the intermediate MUXes 707 of each of the functional blocks 1001. Also, the output of the combinatorial logic 705 of each of the functional blocks 1001 is provided to a corresponding input of the intermediate MUX 707 of the TFB 1005. The intermediate MUX 707 of the TFB 1005 is controlled by a first set of state select signals ST SEL0, the intermediate MUX 707 of FB1 is controlled by a second set of state select signals ST SEL1, the intermediate MUX 707 of FB2 is controlled by a third set of state select signals ST SEL2, and so on up to the intermediate MUX 707 of the last FBN, which is controlled by an Nth+1 set of state select signals ST SELN.

Although only one combinatorial logic 705 and corresponding intermediate MUX 707 are shown with input and output storage devices 703 and 709, it is appreciated that each of the functional blocks TFB and FB1-FBN may include any number of logic and selection paths as known to those skilled in the art. The functional blocks are shown in simplified form to more clearly illustrate embodiments described herein. In any event, the entire internal state of any one of the functional blocks 1001 is copied to the TFB 1005 by controlling the corresponding MUX 707 of the TFB 1005 via the ST SEL0 signals. Also, the entire internal state of the TFB 1005 is copied to the state of any one of the functional blocks 1001 by controlling the corresponding MUX 707 of any of the functional blocks 1001 via the ST SELX signals. For example, the ST SEL1 signals control the MUX 707 of functional block FB 1 to transfer the state of the TFB 1005 to the functional block FB 1. The use of the internal intermediate MUXes 707 within the TFB 1005 and each of the functional blocks 1001 enable seamless functional state transfer between the TFB 1005 and any functional block. As previously described, the state R/W logic 513 provides an alternative method for switching states between functional blocks with reduced signal routing.

Figure 12:
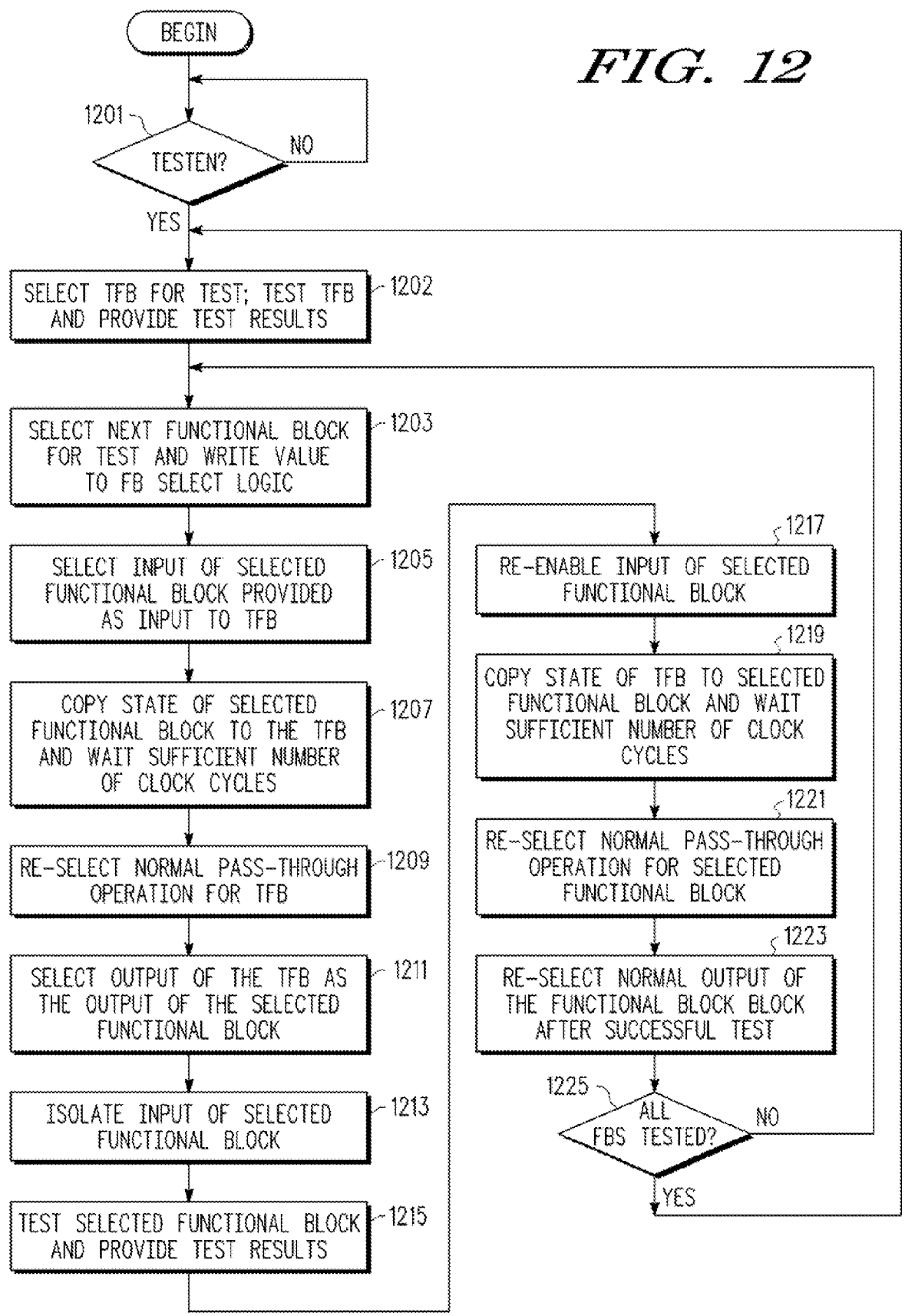
FIG. 12 is a flowchart diagram illustrating operation of the functional block test system of FIG. 10 according to an exemplary embodiment for performing the second substitution test method for continuous testing of repetitive functional blocks during normal functional mode of the IC.

FIG. 12 is a flowchart diagram illustrating operation of the functional block test system of FIG. 10 according to an exemplary embodiment for performing the second substitution test method for continuous testing of repetitive functional blocks during normal functional mode of the IC 101. The functional block test system of FIG. 10 performs seamless testing of the functional blocks during normal operation without interrupting operation of any of the functional blocks. During normal operation, the functional blocks FB1-FBN operate in the normal pass-through mode to process the input signals IN1-INN to the output signals O1-ON selected as the output signals OUT1-OUTN. The TESTEN signal is queried at block 1201 to determine whether continuous testing is enabled. If testing is not enabled, operation remains at block 1201 or otherwise no action is taken. If testing is enabled, operation proceeds to block 1202 in which the TFB 1005 is selected first by the test logic 1009 for testing. It is appreciated that any of the functional blocks FB1-FBN may be selected first for testing rather than the TFB 1005 in an alternative embodiment. It is advantageous, however, to first test the TFB 1005 since it is used to substitute for each of the remaining functional blocks FB1-FBN for testing. In a similar manner previously described, the mapping logic 1010 writes a value indicating the TFB 1005 to the FB select logic 321, which controls the IN SEL signals to control the MUX 311 to select the signal lines 323 as the SELIN to the TFB 1005. Since the signal lines 323 are already isolated via the buffer 304, and since there is no need to transfer state from any other functional block, the TFB 1005 is immediately tested by the test logic 1009 via the test bus 315 at block 1202 and the test logic 1009 provides the TEST RESULTS.

Assuming successful testing of the TFB 1005, operation proceeds to block 1203 to select the "next" (or first) functional block for testing. As previously described, the test logic 1009 employs a round-robin or random or pseudo-random selection process beginning with a predetermined initial functional block to being the continuous testing process. The test logic 1009 controls the mapping logic 1010 to write a corresponding value via the FBS signals to the FB select logic 321. At next block 1205, the input of the selected functional block is selected as the SELIN input to the TFB 1005 by the MUX 311 as controlled by the IN SEL signals output from the FB select logic 321. At next block 1207, the test logic 1009 asserts the ST SEL signals to copy the state of the selected functional block to the TFB 1005 and waits a sufficient number of clock cycles to ensure transfer of state information. As shown in FIG. 11, the ST SEL0 signals are asserted to select outputs from the selected one of the functional blocks FB1-

FBN as input to the MUX 707 of the TFB 1005. At next block 1209, the test logic 1009 controls the mapping logic 1010 to re-select normal pass-through operation of the TFB 1005 so that it shadows operation of the selected functional block. In particular, the ST SEL0 signals are asserted to control the MUX 707 to select the output of the combinatorial logic 705 of the TFB 1005 after the states of the selected functional block have been successfully transferred.

At next block 1211, the test logic 1009 controls the mapping logic 1010 to assert the OUT SEL signals to select the TFBOUT signal output from the TFB 1005 as the output of the selected functional block. At this point the TFB 1005 has been substituted for the selected functional block so that the selected functional block is available for testing. At next block 1213, the test logic 1009 controls the mapping logic 1010 to assert the BUFSEL signals to isolate the input from the selected functional block as previously described. At next block 1215, the test logic 1009 performs the appropriate testing of the selected functional block via the test bus 315 in a similar manner as previously described and provides the TEST RESULTS. At next block 1217, the test logic 1009 controls the mapping logic 1010 to assert the BUFSEL signal to re-enable the input signal to the selected functional block. At next block 1219, the test logic 1009 controls the mapping logic 1010 to assert the ST SEL signals of the selected functional block to copy the state of the TFB 1005 to the selected functional block and waits a sufficient number of clock cycles to ensure transfer of state from TFB 1005 to the selected functional block. For example, if FB1 is the selected functional block that has just been successfully tested, then the ST SEL1 signals are asserted to select the TFB 1005 to transfer state signals from the TFB 1005 back to FB1. At next block 1221, the mapping logic 1010 re-selects normal pass-through operation for the selected functional block so that it resumes control of its normal operations. Again, using FB1 as the example, the mapping logic 1010 controls the ST SEL1 signals for normal pass-through operation of FB1 so that it processes the IN1 signal to provide the O1 signal. At next block 1223, the mapping logic 1010 asserts the OUT SEL signals to re-select the normal output of the selected functional block so that the TFB 1005 is available to test another functional block. Again, using FB1 as the example, the OUT SEL signals are asserted to control the MUX 317 of FB1 so that O1 is selected as the OUT1 signal. In this manner, FB1 resumes its normal functions.

Operation then proceeds to block 1225 to determine whether each of the functional blocks FB1-FBN have been successfully tested. If not, operation returns to block 1203 in which the test logic 1009 selects the next functional block for test (e.g., round-robin order FB1, FB2, . . . , FBN). Operation loops between blocks 1203-1223 to test each of the functional blocks FB1-FBN until each has been successfully tested. After each of the functional blocks FB1-FBN have been successfully tested as determined at block 1225, operation returns instead back to block 1202 to select and test the TFB 1202. In one embodiment, while the IC 101 remains powered up, operation continuously loops between blocks 1202-1225 to test the TFB 1005 and each of the functional blocks 1001 in continuous manner. In another embodiment, after the TFB 1005 and the functional blocks 1001 have been successfully tested, operation terminates until the next power-up of the IC 101.

A method of continuous testing of repetitive functional blocks provided on an integrated circuit (IC) according to one embodiment includes selecting one of the repetitive functional blocks at a time for testing, substituting a test repetitive functional block for a selected repetitive functional block, and testing the selected repetitive functional block during normal functional mode of the IC.

The method may include providing an input for the selected repetitive functional block to an input of the test repetitive functional block, and replacing an output of the selected repetitive functional block with an output of the test repetitive functional block. In one embodiment, the providing and replacing are performed before initialization of the repetitive functional blocks. In this embodiment the state of the functional blocks are the same, since just after reset and before initialization of the blocks.

In another embodiment the method may include copying at least a portion of state information of the selected repetitive functional block to the test repetitive functional block before testing, and copying at least a portion of state information from the test repetitive functional block to the selected repetitive functional block after testing. In this embodiment, testing may be performed at any time during normal operation since the state information is transferred to avoid interrupting normal operations. The method may further include repeating the selecting, substituting, copying and testing for another repetitive functional block, and repeating to test each of the repetitive functional blocks.

In another embodiment, the method may include providing input and state signals of the selected repetitive functional block as input and state signals to the test repetitive functional block before testing, providing input and state signals of the test repetitive functional block as input and state signals to the selected repetitive functional block after testing, and repeating the selecting, substituting, providing and testing other repetitive functional blocks. As an example, the test repetitive functional block includes select logic for selecting state information of the selected repetitive functional block for effectively copying over state information.

The method may include selecting a repetitive functional block as a spare repetitive functional block which is used as a first test repetitive functional block, substituting the first test repetitive functional block for a selected repetitive functional block, selecting the selected repetitive functional block as a next test repetitive functional block after testing, and repeating the selecting, substituting and testing for every other repetitive functional block during normal functional mode of the IC.

An IC according to an exemplary embodiment includes multiple repetitive functional blocks for performing multiple functional block operations during normal functional mode of the IC, and a test system which performs continuous testing of each repetitive functional block while the functional block operations are performed during normal functional mode of the IC.

In one embodiment of the IC, the repetitive functional blocks include a spare repetitive functional block at any given time during normal functional mode. In this case, the test system continuously revises logical mapping of functional block operations onto the repetitive functional blocks to enable testing of each of the repetitive functional block over time.

The IC may include a test bus and test interfaces for coupling each repetitive functional block to the test bus. In this embodiment, the test system may include mapping logic and test logic. The mapping logic selects one of the repetitive functional blocks for testing, and transfers state information of the selected functional block to the spare repetitive functional block. The test logic performs testing of the selected functional block via the test bus. In various embodiments, the spare repetitive functional block is a dedicated test functional block and the remaining functional blocks are operational functional block.

In one dedicated test functional block embodiment, the mapping logic further includes input select logic and output select logic. The input select logic selects an input signal intended for the selected functional block as an input provided to the dedicated test functional block. The output select logic selects an output of the dedicated test functional block as an output substituted for the selected functional block. In another dedicated test functional block embodiment, the mapping logic includes input select logic, state transfer logic, and context switch logic. The input select logic is controllable to select an input signal intended for the selected functional block as an input signal provided to the dedicated test functional block. The state transfer logic is controllable to transfer at least a portion of state information between the dedicated test functional block and an operational functional block. The context switch logic selects an output of the dedicated test functional block as an output substituted for the selected functional block during testing of the selected functional block, and selects an output of the selected functional block after testing. In this last embodiment, the state transfer logic may employ an atomic method to ensure coherency when transferring the state information between the selected functional block and the dedicated test functional block.

In yet another dedicated test functional block embodiment, the dedicated test functional block includes first transfer select logic controlled by the mapping logic to select state signals of any selected one of the operational functional blocks to transfer state of the selected block to the test functional block. Each operational functional block includes second transfer logic controlled by the mapping logic to select state signals of the test functional block to transfer state from the test functional block. Output select logic is provided and controlled by the mapping logic to substitute an output of the test functional block as an output of the selected operational functional block.

In yet another embodiment, each of the repetitive functional blocks includes adjacent select logic controlled by the mapping logic to select an input signal, at least one intermediate state signal, and an output of at least one adjacent functional block. In this case, the mapping logic selects a repetitive functional block as a test functional block and selects an adjacent repetitive functional block as the selected functional block for testing. The mapping logic controls the adjacent select logic of the test functional block to transfer a state of the selected functional block to the test functional block for testing, and then controls the adjacent select logic of the selected functional block to transfer a state of the test functional block to the selected functional block after testing. The mapping logic may be configured to continuously select a successfully tested functional block as a next test functional block and to select another adjacent repetitive functional block as the selected functional block.

A test system provided on an IC according to another embodiment includes multiple repetitive functional blocks representing multiple physical identifications, mapping logic, and a test system. The mapping logic includes multiple logical identifications mapped to the physical identifications, where each logical identification is a corresponding mapping of input and output signals of the repetitive functional blocks. The test system tests a first physical identification of the repetitive functional blocks while a first logical identification is mapped from the first physical identification to a second physical identification of the repetitive functional blocks during normal functional mode of the IC.

In one embodiment of the test system, the repetitive functional blocks include a dedicated test functional block and the remaining blocks are operational functional blocks. The mapping logic maps a logical identification of a selected operational functional block to the dedicated test functional block before initialization of the repetitive functional blocks. In another embodiment of the test system, the mapping logic continuously remaps logical identifications between a selected operational functional block and the dedicated test functional block including copying state information. In another embodiment, each repetitive functional block includes state select logic. In this latter embodiment, the mapping logic continuously remaps logical identifications between a selected operational functional block and the dedicated test functional block, which includes controlling the state logic of the selected operational functional block and the dedicated test functional block.

In another embodiment of the test system, the repetitive functional blocks include adjacent select logic which selects an input signal, at least one intermediate state signal, and an output of at least one adjacent functional block. In this embodiment, the mapping logic continuously remaps logical identifications between a selected pair of repetitive functional blocks, which includes controlling the adjacent select logic of each selected pair of the repetitive functional blocks.

Although the invention is described herein with reference to specific embodiments, various modifications and changes can be made without departing from the scope of the present invention as set forth in the claims below. It should be understood that all circuitry or logic or functional blocks described herein may be implemented either in silicon or another semiconductor material or alternatively by software code representation of silicon or another semiconductor material. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of continuous testing of a plurality of repetitive functional blocks provided on an integrated circuit, comprising:
   providing the plurality of repetitive functional blocks, a test system and select logic on the integrated circuit;
   selecting, by the select logic, one of the plurality of repetitive functional blocks at a time for testing;
   substituting, by the select logic, a test repetitive functional block for a selected repetitive functional block, wherein the test repetitive functional block performs operations of the selected repetitive functional block; and
   testing, by the test system, the selected repetitive functional block during normal functional mode of the integrated circuit.

2. The method of claim 1, wherein said substituting comprises:
   providing an input for the selected repetitive functional block to an input of the test repetitive functional block; and
   replacing an output of the selected repetitive functional block with an output of the test repetitive functional block.

3. The method of claim 2, wherein said providing and replacing are performed prior to initialization of the plurality of repetitive functional blocks.

4. The method of claim 2, further comprising:
prior to said testing, copying at least a portion of state information of the selected repetitive functional block to the test repetitive functional block;
after said testing, copying at least a portion of state information from the test repetitive functional block to the selected repetitive functional block; and
repeating said selecting, substituting, copying and testing for another one of the plurality of repetitive functional blocks.

5. The method of claim 2, further comprising:
prior to said testing, providing input and state signals of the selected repetitive functional block as input and state signals to the test repetitive functional block;
after said testing, providing input and state signals of the test repetitive functional block as input and state signals to the selected repetitive functional block; and
repeating said selecting, substituting, providing and testing for another one of the plurality of repetitive functional blocks.

6. The method of claim 1, further comprising:
selecting one of the plurality of repetitive functional blocks as a spare repetitive functional block which is used as a first test repetitive functional block;
said substituting comprising substituting the first test repetitive functional block for a selected repetitive functional block;
after said testing, selecting the selected repetitive functional block as a next test repetitive functional block; and
repeating said selecting, substituting and testing for every other one of the plurality of repetitive functional blocks during normal functional mode of the integrated circuit.

7. An integrated circuit, comprising:
a plurality of repetitive functional blocks for performing a plurality of functional block operations during normal functional mode of said integrated circuit; and
a test system, coupled to said plurality of repetitive functional blocks, which performs continuous testing of each of said plurality of repetitive functional blocks while performing each of said plurality of functional block operations during said normal functional mode.

8. The integrated circuit of claim 7, further comprising:
said plurality of repetitive functional blocks including a spare repetitive functional block at any given time during said normal functional mode; and
wherein said test system continuously revises logical mapping of said plurality of functional block operations onto said plurality of repetitive functional blocks to enable testing of each of said plurality of repetitive functional blocks over time.

9. The integrated circuit of claim 8, further comprising:
a test bus;
wherein each of said plurality repetitive functional blocks comprises a test interface coupled to said test bus; and
wherein said test system, comprises:
mapping logic, coupled to said plurality of repetitive functional blocks, which selects one of said plurality of repetitive functional blocks as a selected functional block for testing, and which transfers state information of said selected functional block to said spare repetitive functional block; and
test logic, coupled to said test bus, which performs testing of said selected functional block via said test bus.

10. The integrated circuit of claim 9, wherein:
said spare repetitive functional block comprises a dedicated test functional block and wherein remaining functional blocks comprise a plurality of operational functional blocks; and
wherein said mapping logic further comprises:
input select logic which selects an input signal intended for said selected functional block as an input provided to said dedicated test functional block; and
output select logic which selects an output of said dedicated test functional block as an output substituted for said selected functional block.

11. The integrated circuit of claim 9, wherein:
said spare repetitive functional block comprises a dedicated test functional block and wherein remaining functional blocks comprise a plurality of operational functional blocks; and
wherein said mapping logic comprises:
input select logic which is controllable to select an input signal intended for said selected functional block as an input signal provided to said dedicated test functional block;
state transfer logic, coupled to each of said plurality of repetitive functional blocks, which is controllable to transfer at least a portion of state information between said dedicated test functional block and any one of said plurality of operational functional blocks; and
context switch logic which selects an output of said dedicated test functional block as an output substituted for said selected functional block during testing of said selected functional block, and which selects an output of said selected functional block after testing.

12. The integrated circuit of claim 11, wherein said state transfer logic employs an atomic method to ensure coherency when transferring said at least a portion of state information between said selected functional block and said dedicated test functional block.

13. The integrated circuit of claim 9, further comprising:
said spare repetitive functional block comprising a dedicated test functional block and wherein remaining functional blocks comprise a plurality of operational functional blocks;
said dedicated test functional block comprising first transfer select logic controlled by said mapping logic to select state signals of any selected one of said plurality of operational functional blocks to transfer state of said selected one of said plurality of operational functional blocks to said test functional block;
each of said plurality of operational functional blocks comprising second transfer logic controlled by said mapping logic to select state signals of said test functional block to transfer state from said test functional block; and
output select logic controlled by said mapping logic to substitute an output of said test functional block as an output of any selected one of said plurality of operational functional blocks.

14. The integrated circuit of claim 9, further comprising:
each of said plurality of repetitive functional blocks comprising adjacent select logic controlled by said mapping logic to select an input signal, at least one intermediate state signal, and an output of at least one adjacent functional block;
wherein said mapping logic selects one of said plurality of repetitive functional blocks as a test functional block and selects another repetitive functional block which is adjacent to said test functional block as said selected functional block for testing; and
wherein said mapping logic controls said adjacent select logic of said test functional block to transfer a state of said selected functional block to said test functional block for testing, and which controls said adjacent select logic of said selected functional block to transfer a state of said test functional block to said selected functional block after testing.

15. The integrated circuit of claim 14, wherein said mapping logic continuously selects a successfully tested functional block as a next test functional block and selects another repetitive functional block which is adjacent to said next test functional block as said selected functional block.

16. A test system provided on an integrated circuit, comprising:
a plurality of repetitive functional blocks representing a plurality of physical identifications;
mapping logic, coupled to said plurality of repetitive functional blocks, comprising a plurality of logical identifications mapped to said plurality of physical identifications, each of said plurality of logical identifications comprising a corresponding mapping of input and output signals of said plurality of repetitive functional blocks; and
a test system, coupled to said plurality of repetitive functional blocks and said mapping logic, which tests a first physical identification of said plurality of repetitive functional blocks while a first logical identification is mapped from said first physical identification to a second physical identification of said plurality of repetitive functional blocks during said normal functional mode of the integrated circuit.

17. The test system of claim 16, wherein:
said plurality of repetitive functional blocks comprises a dedicated test functional block and a plurality of operational functional blocks; and
wherein said mapping logic maps a logical identification of a selected operational functional block to said dedicated test functional block prior to initialization of said plurality of repetitive functional blocks.

18. The test system of claim 16, wherein:
said plurality of repetitive functional blocks comprises a dedicated test functional block and a plurality of operational functional blocks; and
wherein said mapping logic continuously remaps logical identifications between a selected operational functional block and said dedicated test functional block including copying state information.

19. The test system of claim 16, wherein:
said plurality of repetitive functional blocks comprises a dedicated test functional block and a plurality of operational functional blocks, and wherein each of said plurality of repetitive functional blocks comprises state select logic; and
wherein said mapping logic continuously remaps logical identifications between a selected operational functional block and said dedicated test functional block including controlling said state logic of said selected operational functional block and said dedicated test functional block.

20. The test system of claim 16, wherein:
each of said plurality of repetitive functional blocks comprises adjacent select logic which selects an input signal, at least one intermediate state signal, and an output of at least one adjacent functional block; and
wherein said mapping logic continuously remaps logical identifications between a selected pair of repetitive functional blocks including controlling said adjacent select logic of each of said selected pair of repetitive functional blocks.

* * * * *